United States Patent
Kasahara et al.

(10) Patent No.: US 11,827,789 B2
(45) Date of Patent: Nov. 28, 2023

(54) THERMOSETTING RESIN COMPOSITION, INTERLAYER INSULATION RESIN FILM, COMPOSITE FILM, PRINTED WIRING BOARD, AND PRODUCTION METHOD THEREOF

(71) Applicant: HITACHI CHEMICAL COMPANY, LTD., Tokyo (JP)

(72) Inventors: Aya Kasahara, Tokyo (JP); Tetsurou Iwakura, Tokyo (JP)

(73) Assignee: RESONAC CORPORATION, Tokyo (JP)

( * ) Notice: Subject to any disclaimer, the term of this patent is extended or adjusted under 35 U.S.C. 154(b) by 174 days.

(21) Appl. No.: 16/318,154

(22) PCT Filed: Jul. 19, 2017

(86) PCT No.: PCT/JP2017/026103
§ 371 (c)(1),
(2) Date: Jan. 16, 2019

(87) PCT Pub. No.: WO2018/016524
PCT Pub. Date: Jan. 25, 2018

(65) Prior Publication Data
US 2019/0284395 A1 Sep. 19, 2019

(30) Foreign Application Priority Data

Jul. 20, 2016 (JP) .................................. 2016-142864
Jul. 20, 2016 (JP) .................................. 2016-142865

(51) Int. Cl.
*C08L 79/08* (2006.01)
*B32B 27/20* (2006.01)
(Continued)

(52) U.S. Cl.
CPC .............. *C08L 79/08* (2013.01); *B32B 27/20* (2013.01); *B32B 27/34* (2013.01); *B32B 27/38* (2013.01);
(Continued)

(58) Field of Classification Search
None
See application file for complete search history.

(56) References Cited

U.S. PATENT DOCUMENTS

2005/0019554 A1* 1/2005 Orikabe ............... H05K 3/4661
428/327
2013/0105200 A1* 5/2013 Ohigashi ................. B32B 19/02
174/250

(Continued)

FOREIGN PATENT DOCUMENTS

CN 1861374 A 11/2006
CN 101260221 A 9/2008
(Continued)

OTHER PUBLICATIONS

Degussa, "Product Information Aerosil R972," https://www.kalekimya.com/admin/tds/1417165123_aerosil-r972_tds.pdf (2021). (Year: 2021).*

*Primary Examiner* — Randy P Gulakowski
*Assistant Examiner* — Ha S Nguyen
(74) *Attorney, Agent, or Firm* — FITCH, EVEN, TABIN & FLANNERY, LLP

(57) ABSTRACT

The present invention relates to a thermosetting resin composition containing an inorganic filler (A1) containing a nanofiller (a), a thermosetting resin (B), and an elastomer (C); and a thermosetting resin composition containing an inorganic filler (A2), a thermosetting resin (B), and an elastomer (C), wherein the inorganic filler (A2) has at least two peaks of a first peak and a second peak in a particle size distribution measured according to the laser diffraction scattering method, and a peak position of the first peak (Continued)

appears at 0.3 to 0.7 μm, while a peak position of the second peak appears at 0.7 to 1.2 μm.

8 Claims, 1 Drawing Sheet

(51) Int. Cl.

| | | |
|---|---|---|
| *B32B 27/34* | (2006.01) | |
| *B32B 27/38* | (2006.01) | |
| *C08K 3/00* | (2018.01) | |
| *C08K 3/013* | (2018.01) | |
| *C08L 15/00* | (2006.01) | |
| *C08L 53/00* | (2006.01) | |
| *C08L 101/00* | (2006.01) | |
| *H01B 3/30* | (2006.01) | |
| *H05K 1/03* | (2006.01) | |
| *C08C 19/36* | (2006.01) | |
| *B32B 27/08* | (2006.01) | |
| *C08L 47/00* | (2006.01) | |
| *C08K 3/36* | (2006.01) | |
| *C08L 63/00* | (2006.01) | |

(52) U.S. Cl.
CPC ............... *C08K 3/00* (2013.01); *C08K 3/013* (2018.01); *C08K 3/36* (2013.01); *C08L 15/00* (2013.01); *C08L 63/00* (2013.01); *C08L 101/00* (2013.01); *H01B 3/30* (2013.01); *H05K 1/03* (2013.01); *B32B 2307/204* (2013.01); *B32B 2457/08* (2013.01); *C08C 19/36* (2013.01); *C08K 2201/005* (2013.01); *C08L 2203/16* (2013.01)

(56) References Cited

U.S. PATENT DOCUMENTS

| | | | | |
|---|---|---|---|---|
| 2014/0080941 | A1* | 3/2014 | Lee | C08J 5/18 |
| | | | | 523/456 |
| 2014/0199533 | A1* | 7/2014 | Matsuura | H05K 3/4673 |
| | | | | 428/215 |
| 2014/0367147 | A1 | 12/2014 | Moon | |
| 2015/0344733 | A1* | 12/2015 | Tomizawa | C08K 9/04 |
| | | | | 428/447 |
| 2017/0022356 | A1* | 1/2017 | Yamazawa | H01L 24/83 |

FOREIGN PATENT DOCUMENTS

| | | | | | |
|---|---|---|---|---|---|
| CN | 103374219 | A | | 10/2013 | |
| CN | 104231545 | A | | 12/2014 | |
| CN | 105658727 | A | | 6/2016 | |
| CN | 106574110 | A | | 4/2017 | |
| JP | 2005-039247 | A | | 2/2005 | |
| JP | 2007-087982 | A | | 4/2007 | |
| JP | 2007273616 | A | * | 10/2007 | |
| JP | 2009-280758 | A | | 12/2009 | |
| JP | 2012211225 | A | * | 11/2012 | |
| JP | 2012255058 | A | * | 12/2012 | |
| JP | 2013-224373 | A | | 10/2013 | |
| JP | 2014-095063 | A | | 5/2014 | |
| JP | 2014-136779 | A | | 7/2014 | |
| JP | 2014-218600 | A | | 11/2014 | |
| JP | 5881027 | B1 | * | 3/2016 | |
| JP | 5881027 | B1 | | 3/2016 | |
| JP | 2016-172790 | A | | 9/2016 | |
| KR | 10-1027303 | B1 | | 4/2011 | |
| TW | 200503600 | A | | 1/2005 | |
| WO | WO-2014112464 | A1 | * | 7/2014 | ............... C08J 5/24 |
| WO | 2015/079708 | A1 | | 6/2015 | |
| WO | WO-2015079708 | A1 | * | 6/2015 | ............ H01L 24/29 |

\* cited by examiner

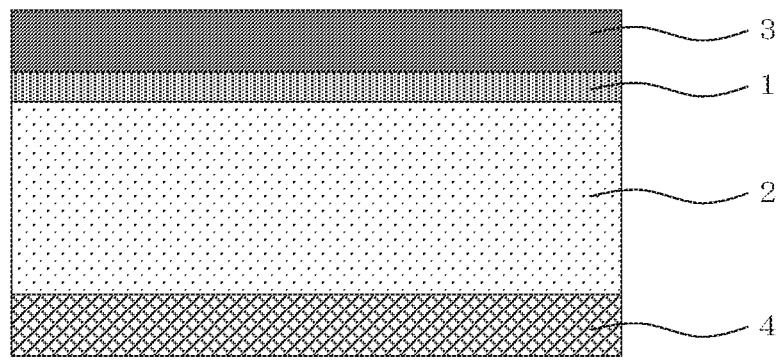

THERMOSETTING RESIN COMPOSITION, INTERLAYER INSULATION RESIN FILM, COMPOSITE FILM, PRINTED WIRING BOARD, AND PRODUCTION METHOD THEREOF

CROSS-REFERENCE TO RELATED APPLICATIONS

This application is a U.S. national phase application filed under 35 U.S.C. § 371 of International Application No. PCT/JP2017/026103, filed Jul. 19, 2017, designating the United States, which claims benefit from Japanese Patent Application 2016-142864, filed Jul. 20, 2016, and Japanese Patent Application 2016-142865, filed Jul. 20, 2016, which are hereby incorporated herein by reference in their entirety.

TECHNICAL FIELD

The present invention relates to a thermosetting resin composition, a resin film for interlayer insulation, a composite film, a printed wiring board, and method of producing the same.

BACKGROUND ART

In recent years, miniaturization, weight reduction, multi-functionalization, and so on of electronic devices are much advanced. Following this, LSI (large scale integration) and high integration of chip components, etc. are advanced, and forms thereof are rapidly changed to a multi-pin or miniaturized form. For this reason, in order to improve a mounting density of electronic devices, the development of fine wiring of multi-layered printed wiring boards is advanced. As the multi-layered printed wiring boards which are in agreement with these demands, multi-layered printed wiring boards having a build-up structure using a glass cloth-free insulating resin film as an insulating layer (hereinafter also referred to as "build-up layer") in place of a prepreg are becoming the main current as a printed wiring board suited for miniaturization, weight reduction, and microfabrication.

In addition, in recent years, computers and information and communication equipment are towards high performance and high functionality more and more, and in order to process a large quantity of data at a high speed, processed signals tend to become higher in frequency. In particular, as for a frequency domain of radio waves used for mobile phones and satellite broadcasting, a high-frequency domain of a GHz band is used, and it is required to suppress a transmission loss to be caused due to high frequency. For that reason, as organic materials to be used in a high-frequency domain, materials with low dielectric constant and dielectric tangent are desired.

In response to such requirements, various grappling approaches relative to the build-up layer have been taken, too. For example, PTL 1 discloses a resin composition containing a cyanate resin.

Meanwhile, as for the build-up layer, in order to improve the processing dimensional stability and also to reduce the amount of warpage after mounting a semiconductor, reduction in thermal expansion is demanded. As one of methods of reducing the thermal expansion of the build-up layer, a method in which a filler is highly filled is exemplified. For example, by incorporating a silica filler in an amount of 40% by mass or more in the build-up layer, it is contemplated to reduce the thermal expansion of the build-up layer (see PTLs 2 to 4).

CITATION LIST

Patent Literature

PTL 1: JP 2014-136779 A
PTL 2: JP 2007-87982 A
PTL 3: JP 2009-280758 A
PTL 4: JP 2005-39247 A

SUMMARY OF INVENTION

Technical Problem

However, as a next-generation material, the demand of a material with a low dielectric tangent in a higher frequency domain than that in the resin composition disclosed in PTL 1 is increasing. In addition, as a next-generation material, the demand of a material with lower thermal expansion than that in the resin compositions disclosed in PTLs 2 to 4 is increasing. However, if the filler is highly filled in order to enhance low thermal expansion properties, the minimum melt viscosity increases, and therefore, there is a case where wiring embedding properties and flatness of the surface formed through embedding of the wiring are worsened.

In view of the foregoing circumstances, the present invention has been made, and an object thereof is to provide a thermosetting resin composition which is low in dielectric tangent and excellent in wiring embedding properties and flatness; a resin film for interlayer insulation using same, a composite film, and a printed wiring board, each using the same; and a method of producing the same.

Solution to Problem

In order to solve the foregoing problem, the present inventors made extensive and intensive investigations. As a result, it has been found that the foregoing problem can be solved by the following present invention.

Specifically, the present invention provides the following [1] to [15].

[1] A thermosetting resin composition containing an inorganic filler (A1) containing a nanofiller (a), a thermosetting resin (B), and an elastomer (C).

[2] The thermosetting resin composition as set forth in the above [1], wherein the content of the nanofiller (a) is from 0.1 to 1.0% by mass relative to the total amount of the inorganic filler (A1).

[3] The thermosetting resin composition as set forth in the above [1] or [2], wherein the content of the inorganic filler (A1) is 60% by mass or more based on the solid content of the thermosetting resin composition.

[4] A thermosetting resin composition containing an inorganic filler (A2), a thermosetting resin (B), and an elastomer (C), wherein
the inorganic filler (A2) has at least two peaks of a first peak and a second peak in a particle size distribution measured according to the laser diffraction scattering method; and
a peak position of the first peak appearing at 0.3 to 0.7 μm, while a peak position of the second peak appearing at 0.7 to 1.2 μm.

[5] The thermosetting resin composition as set forth in the above [4], wherein the content of the inorganic filler (A2) is 60% by mass or more based on the solid content of the thermosetting resin composition.

[6] The thermosetting resin composition as set forth in any of the above [1] to [5], wherein the thermosetting resin (B) is a polyimide compound having a structural unit derived from a maleimide compound (b1) having at least two N-substituted maleimide groups and a structural unit derived from a diamine compound (b2).

[7] The thermosetting resin composition as set forth in any of the above [1] to [6], the elastomer (C) is a polybutadiene-based elastomer modified with an acid anhydride.

[8] A resin film for interlayer insulation, including the thermosetting resin composition as set forth in any of the above [1] to [7].

[9] A composite film, including a first resin layer including the thermosetting resin composition as set forth in any of the above [1] to [7] and a second resin layer.

[10] The composite film as set forth in the above [9], wherein the second resin layer includes a thermosetting resin composition for second resin layer containing a polyfunctional epoxy resin (D), an active ester curing agent (E), and a phenolic hydroxy group-containing polybutadiene-modified polyamide resin (F).

[11] The composite film as set forth in the above [10], wherein an equivalent ratio ((ester group)/(epoxy group)) of an epoxy group of the active ester curing agent (E) to an epoxy group of the polyfunctional epoxy resin (D) in the thermosetting resin composition for second resin layer is 0.05 to 1.5.

[12] The composite film as set forth in the above [10] or [11], wherein the thermosetting resin composition for second resin layer further contains a phosphorus-based curing agent (G).

[13] The composite film as set forth in any of the above [9] to [12], which exhibits a dielectric tangent at 5 GHz of 0.005 or less in terms of a cured material thereof.

[14] A printed wiring board including a cured material of the resin film for interlayer insulation as set forth in the above [8] or a cured material of the composite film as set forth in any of the above [9] to [13].

[15] A method of producing a printed wiring board, including a step of laminating the resin film for interlayer insulation as set forth in the above [8] or the composite film as set forth in any of the above [9] to [13] on one or both surfaces of a base material.

Advantageous Effects of Invention

In accordance with the present invention, it is possible to provide a thermosetting resin composition which is low in dielectric tangent and excellent in wiring embedding properties and flatness; a resin film for interlayer insulation, a composite film, and a printed wiring board, each using the same; and a method of producing the same.

BRIEF DESCRIPTION OF DRAWING

FIG. 1 is a view schematically showing a composite film of the present embodiment.

DESCRIPTION OF EMBODIMENTS

The present embodiment is hereunder explained in detail. In the present specification, a numerical value range of X or more and Y or less (X and Y are each the real number) may be expressed as "X to Y". For example, a description of "0.1 to 2" denotes a numerical value range of 0.1 or more and 2 or less, and 0.1, 0.34, 1.03, 2, and the like are included in the foregoing numerical value range. In addition, the present embodiment is merely an embodiment of the present invention and does not restrict the present invention.

The "resin composition" as referred to in the present specification includes a mixture of respective components as mentioned later and a material obtained by semi-curing the foregoing mixture (in a so-called B-stage state).

The "interlayer insulating layer" as referred to in the present specification is a layer positioning between two conductor layers and serving to insulate the conductor layers. Examples of the "interlayer insulating layer" in the present specification include a cured material of a resin film for interlayer insulation, a cured material of a composite film, and so on. The term "layer" referred to in the present specification also includes one in which a part thereof is chipped and one in which a via or pattern is formed.

[Thermosetting Resin Composition]

The present invention discloses thermosetting resin compositions of the following <1> and <2>.

<1> A thermosetting resin composition containing an inorganic filler (A1) containing a nanofiller (a), a thermosetting resin (B), and an elastomer (C).

<2> A thermosetting resin composition containing an inorganic filler (A2), a thermosetting resin (B), and an elastomer (C), wherein
the inorganic filler (A2) has at least two peaks of a first peak and a second peak in a particle size distribution measured according to the laser diffraction scattering method; and
a peak position of the first peak appears at 0.3 to 0.7 μm, while a peak position of the second peak appears at 0.7 to 1.2 μm.

Hereunder, the thermosetting resin composition of the above <1> is referred to as "first thermosetting resin composition", and the thermosetting resin composition of the above <2> is referred to as "second thermosetting resin composition". In the case of referring to simply as "thermosetting resin composition", both the "first thermosetting resin composition" and the "second thermosetting resin composition" are referred to.

<Inorganic Fillers (A1) and (A2)>

The first and second thermosetting resin compositions each contain an inorganic filler.

The inorganic filler (A1) which the first thermosetting resin composition contains is one containing a nanofiller (a); and the inorganic filler (A2) which the second thermosetting resin composition contains is one having at least two peaks of a first peak and a second peak in a particle size distribution measured according to the laser diffraction scattering method, in which a peak position of the first peak appears at 0.3 to 0.7 μm, while a peak position of the second peak appears at 0.7 to 1.2 μm.

An average particle diameter as referred to in the present specification indicates a particle diameter at a point corresponding to a volume of 50% when a total volume of the particles is defined as 100%, and a cumulative frequency distribution curve by the particle diameter is determined, and it can be measured by a particle size distribution measurement device adopting the laser diffraction scattering method, or the like.

The inorganic fillers (A1) and (A2) are hereunder explained in order.

(Inorganic Filler (A1))

The inorganic filler (A1) which the first thermosetting resin composition contains is one containing a nanofiller (a).

The nanofiller (a) refers to an inorganic filler having an average particle diameter of 300 nm or less. Although the nanofiller (a) is not particularly limited, examples thereof include a nanofiller of silica, a nanofiller of alumina, and a nanofiller of titanium oxide, and from the standpoint of more reducing a coefficient of thermal expansion, a nanofiller of silica is preferred. Examples of the silica include spherical silica, amorphous silica, fused silica, crystalline silica, and synthetic silica. It is preferred that the nanofiller (a) is spherical from the viewpoints of improvement in dispersibility in the resin composition, improvement in dispersibility in a resin varnish having the resin composition dissolved or dispersed in an organic solvent, improvement in fluidity to be caused due to a reduction of viscosity of a resin varnish, suppression of an increase of surface roughness of the insulating layer to be formed from the resin composition, and so on.

The average particle diameter of the nanofiller (a) is preferably 200 nm or less, and more preferably 100 nm or less. In the case where the average particle diameter is 200 nm or less, there is a tendency that the fluidity of the inorganic filler (A1) containing the nanofiller (a) becomes excellent, and that the wiring embedding properties and surface flatness are excellent. In addition, the average particle diameter of the nanofiller (a) is preferably 10 nm or more, and more preferably 30 nm or more. From the standpoints that the fluidity of the inorganic filler (A1) is most improved, and that the wiring embedding properties and surface flatness are excellent, when the average particle diameter with respect to the whole of the inorganic filler (A1) is 0.5 µm, it is most preferred to use nanosilica having an average particle diameter of 50 nm as the nanofiller (a).

In view of the fact that in the case of forming the resin composition into a resin varnish, an increase of the varnish viscosity is suppressed, and the handling properties become excellent, the content of the nanofiller (a) is preferably 0.05 to 5.0% by mass, more preferably 0.07 to 3.0% by mass, and still more preferably 0.1 to 1.0% by mass on a basis of the total amount of the inorganic filler (A1). When the content of the nanofiller (a) is the aforementioned lower limit value or more, in particular, 0.1% by mass or more, there is a tendency that the fluidity of the inorganic filler (A1) becomes excellent, and that the wiring embedding properties and surface flatness are improved.

From the viewpoint of enhancing the dispersibility of the nanofiller (a) in the resin composition, it is preferred to use the nanofiller (a) in a state of slurry in which it is previously dispersed in an organic solvent, as the need arises. Although the organic solvent which is used for forming the nanofiller (a) in a slurry is not particularly limited, for example, organic solvents exemplified in a production step of a thermosetting resin (B) as mentioned later are applicable. These may be used alone, or may be used in combination of two or more thereof. In addition, of these organic solvents, methyl ethyl ketone, methyl isobutyl ketone, and cyclohexanone are preferred from the viewpoint of higher dispersibility.

Although a solid content concentration of the slurry of the nanofiller (a) is not particularly limited, for example, from the viewpoints of settleability and dispersibility of the nanofiller (a), it is preferably 30 to 80% by mass, and more preferably 40 to 70% by mass.

It is preferred that the inorganic filler (A1) contains the nanofiller (a) and an inorganic filler (a') other than the nanofiller (a).

The inorganic filler (a') is not particularly limited, and examples thereof include silica, alumina, barium sulfate, talc, clay, mica powder, aluminum hydroxide, magnesium hydroxide, calcium carbonate, magnesium carbonate, magnesium oxide, boron nitride, aluminum borate, barium titanate, strontium titanate, calcium titanate, magnesium titanate, bismuth titanate, titanium oxide, barium zirconate, and calcium zirconate. These may be used alone, or may be used in combination of two or more thereof. Of these, from the viewpoint of more reducing a coefficient of thermal expansion, it is preferred to contain silica as the inorganic filler (a'). Examples of the silica include spherical silica, amorphous silica, fused silica, crystalline silica, and synthetic silica.

Although the shape of the inorganic filler (a') may be spherical, fragmental, acicular, or platy, it is preferably spherical from the viewpoints of improvement in dispersibility in the resin composition, improvement in dispersibility in a resin varnish having the resin composition dissolved or dispersed in an organic solvent, improvement in fluidity to be caused due to a reduction of viscosity of a resin varnish, suppression of an increase of surface roughness of the insulating layer to be formed from the resin composition, and so on.

An average particle diameter of the inorganic filler (a') is preferably 1 µm or less, and more preferably 0.7 µm or less. When the average particle diameter of the inorganic filler (a') is 1 µm or less, there is a tendency that the adhesion of the insulating layer formed from the resin composition to plated copper is excellent. In addition, in the case of forming the resin composition containing the inorganic filler (a') into a resin varnish, from the viewpoints of suppressing an increase of the viscosity and making the handling properties excellent, the average particle diameter of the inorganic filler (a') is preferably 0.31 µm or more, more preferably 0.35 µm or more, and still more preferably 0.4 µm or more.

In the case where the inorganic filler (A1) contains the nanofiller (a) and the inorganic filler (a'), when the particle size distribution is measured by the aforementioned method, the average particle diameter of the inorganic filler (A1) is occasionally calculated as an average particle diameter of the group of particles totalizing the nanofiller (a) and the inorganic filler (a') other than the nanofiller (a). In this case, what a peak appears in a portion corresponding to the nanofiller (a) in the particle size distribution is considered as the matter that the nanofiller (a) is contained.

From the viewpoints of adhesion to plated copper, fluidity, and handling properties, the average particle diameter as the inorganic filler (A1) is preferably 0.01 to 1 µm, more preferably 0.05 to 0.8 µm, and still more preferably 0.1 to 0.7 µm.

From the viewpoint of enhancing the dispersibility in the resin composition, it is preferred to use the inorganic filler (a') in a state of slurry in which it is previously dispersed in an organic solvent. Although the organic solvent which is used for forming the inorganic filler (a') in a slurry is not particularly limited, for example, organic solvents exemplified in a production step of a polyimide compound (B1) as mentioned later are applicable. These may be used alone, or may be used in combination of two or more thereof. Of these organic solvents, methyl ethyl ketone, methyl isobutyl ketone, and cyclohexanone are preferred from the viewpoint of higher dispersibility.

Although a solid content concentration of the slurry of the inorganic filler (a') is not particularly limited, for example, from the viewpoints of settleability and dispersibility of the inorganic filler (a'), it is preferably 50 to 80% by mass, and more preferably 60 to 75% by mass.

For the purpose of improving the dispersibility of the inorganic filler (A1) and the adhesion between the inorganic filler (A1) and the organic components in the resin composition, a coupling agent may be used, as the need arises. The coupling agent is not particularly limited, and examples thereof include silane coupling agents and titanate coupling agents, and aminosilane-based coupling agents are preferred. These may be used alone, or may be used in combination of two or more thereof.

In the case of using a coupling agent, the use amount thereof is not particularly limited, and for example, it is preferably 0.1 to 5% by mass, and more preferably 0.5 to 3% by mass on a basis of the total amount of the inorganic filler (A1) used. When the use amount of the coupling agent falls within this range, advantages to be brought due to the use of the inorganic filler (A1) can be more effectively exhibited.

In the case of using a coupling agent, though its addition system may be a so-called integral blending treatment system in which the inorganic filler (A1) is blended in the resin composition, and the coupling agent is then added, from the viewpoint of more effectively revealing the advantages of the inorganic filler (A1), a system in which the inorganic filler (A1) before blending is subjected to a surface treatment with the coupling agent in a dry or wet mode.

Although the content of the inorganic filler (A1) can be properly selected according to the required characteristics and functions for the first thermosetting resin composition of the present embodiment, for example, it is 40 to 90% by mass, preferably 60% by mass or more, more preferably 60 to 85% by mass, and still more preferably 65 to 80% by mass in the solid content of the first thermosetting resin composition. By allowing the content of the inorganic filler (A1) to fall within such a range, a low coefficient of thermal expansion and excellent wiring embedding properties and flatness can be made compatible with each other.

In the present specification, the solid content which is contained in the resin composition means a residue resulting from removal of the volatile component from the components constituting the resin composition.

(Inorganic Filler (A2)>

Next, the inorganic filler (A2) which the second thermosetting resin composition contains is explained.

The inorganic filler (A2) has at least two peak of a first peak and a second peak in a particle size distribution measured according to the laser diffraction scattering method, in which a peak position of the first peak appears at 0.3 to 0.7 μm, and preferably 0.4 to 0.6 μm, and a peak position of the second peak appears at 0.7 to 1.2 μm, preferably more than 0.7 μm and 1.2 μm or less, and more preferably 0.8 to 1.1 μm. When the peak positions of the first peak and the second peak fall within the aforementioned ranges, respectively, there is a tendency that the dielectric tangent is low, the thermal expansion is low, and the wiring embedding properties and flatness are excellent.

An average particle diameter of the inorganic filler (A2) is preferably 5.0 μm or less, more preferably 2.0 μm or less, and still more preferably 0.8 μm or less. When the average particle diameter of the inorganic filler (A2) is 5.0 μm or less, there is a tendency that the adhesion of the insulating layer formed from the resin composition to plated copper is excellent. In addition, in the case of forming the resin composition containing the inorganic filler (A2) into a resin varnish, from the viewpoints of suppressing an increase of the viscosity and making the handling properties excellent, the average particle diameter of the inorganic filler (A2) is preferably 0.01 μm or more, more preferably 0.05 μm or more, and still more preferably 0.1 μm or more.

For the purpose of improving the dispersibility of the inorganic filler (A2) and the adhesion between the inorganic filler (A2) and the organic components in the resin composition, a coupling agent may be used, as the need arises.

Examples of the coupling agent include the same coupling agents which are applicable for the inorganic filler (A1). Of these, from the viewpoint of improvement in dispersibility of the inorganic filler (A2) and the viewpoint of improvement in adhesion between the inorganic filler (A2) and the organic components, an aminosilane-based coupling agent is preferred. These may be used alone, or may be used in combination of two or more thereof.

As for the use amount and addition system of the coupling agent, the same explanations as in the inorganic filler (A1) are applicable.

From the viewpoint of enhancing the dispersibility in the resin composition, it is preferred to use the inorganic filler (A2) in a state of slurry in which it is previously dispersed in an organic solvent. Although the organic solvent which is used for forming the inorganic filler (A2) in a slurry is not particularly limited, for example, the organic solvents exemplified in a production method of the polyimide compound (B1) as mentioned later are applicable. These may be used alone, or may be used in combination of two or more thereof. Of these organic solvents, methyl ethyl ketone, methyl isobutyl ketone, and cyclohexanone are preferred from the viewpoint of higher dispersibility.

Although a solid content concentration of the slurry of the inorganic filler (A2) is not particularly limited, for example, from the viewpoints of settleability and dispersibility of the inorganic filler (A2), it is preferably 50 to 80% by mass, and more preferably 60 to 75% by mass.

Although the content of the inorganic filler (A2) can be properly selected according to the required characteristics and functions for the second thermosetting resin composition of the present embodiment, for example, it is 40 to 90% by mass, preferably 60% by mass or more, more preferably 60 to 85% by mass, and still more preferably 65 to 80% by mass in the solid content of the second thermosetting resin composition. By allowing the content of the inorganic filler (A2) to fall within such a range, a low coefficient of thermal expansion and excellent wiring embedding properties and flatness can be made compatible with each other.

The inorganic filler (A1) and the inorganic filler (A2) may be the same as each other. Namely, the thermosetting resin composition of the present embodiment may be one containing the nanofiller (a) having an average particle diameter of 300 nm or less and having at least two peaks of a first peak and a second peak in a particle size distribution measured according to the laser diffraction scattering method, in which a peak position of the first peak appears at 0.3 to 0.7 μm, while a peak position of the second peak appears at 0.7 to 1.2 μm. In this case, for example, the inorganic filler may also be one having at least the first peak, the second peak, and a third peak derived from the nanofiller (a) in a particle size distribution measured according to the laser diffraction scattering method, in which a peak position of the first peak appears at 0.3 to 0.7 μm, a peak position of the second peak appears at 0.7 to 1.2 μm, and a peak position of the third peak appears at less than 300 nm. In addition, the first peak may be a peak derived from the nanofiller (a), and in that case, the third peal may be present, or may not be present. Preferred peak positions conform to the description as mentioned above.

<Thermosetting Resin (B)>

The thermosetting resin (B) is not particularly limited, and a polyimide resin, an epoxy resin, a cyanate resin, a maleimide resin, and the like can be used. Of these, a maleimide resin is preferred, and from the viewpoint of exhibiting low thermal expansion, a polyimide compound having a structural unit derived from a maleimide compound (b1) having at least two N-substituted maleimide groups and a structural unit derived from a diamine compound (b2) (the polyimide compound will be hereinafter also referred to as "polyimide compound (B1)") is more preferred.

The maleimide compound (b1) having at least two N-substituted maleimide groups and the diamine compound (b2) are not particularly limited.

The maleimide compound (b1) having at least two N-substituted maleimide groups (hereinafter also referred to as "component (b1)") is not particularly limited so long as it is a maleimide compound having two or more N-substituted maleimide groups.

Although examples of the component (b1) is not particularly limited, examples thereof include bis(4-maleimidophenyl)methane, polyphenylmethane maleimide, bis(4-maleimidophenyl)ether, bis(4-maleimidophenyl)sulfone, 3,3'-dimethyl-5,5'-diethyl-4,4'-diphenylmethanebismaleimide, 4-methyl-1,3-phenylenebismaleimide, m-phenylenebismaleimide, 2,2-bis[4-(4-maleimidophenoxy)phenyl]propane, and 1,6-bismaleimido-(2,2,4-trimethyl)hexane. These may be used alone, or may be used in combination of two or more thereof. Of these, bis(4-maleimidophenyl)methane is preferred from the standpoint that it is inexpensive; 3,3'-dimethyl-5,5'-diethyl-4,4'-diphenylmethanebismaleimide is preferred from the standpoint that it is excellent in dielectric characteristics and low in water absorptivity; 2,2-bis[4-(4-maleimidophenoxy)phenyl]propane and 1,6-bismaleimido-(2,2,4-trimethyl)hexane are preferred from the standpoint that it is excellent in mechanical characteristics, such as high adhesion to a conductor, elongation of a cured material, breaking strength, and elastic modulus, and dielectric characteristics.

Examples of the structural unit derived from the component (b1) include a group represented by the following general formula (1-1) and a group represented by the following general formula (1-2).

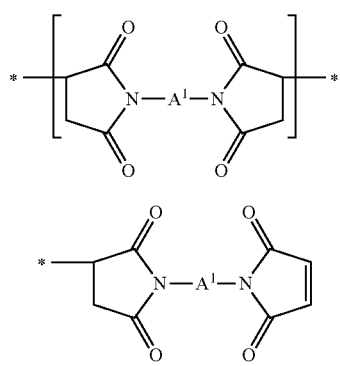

In the general formulae (1-1) and (1-2), $A^1$ represents a residue of the component (b1); and * represents a bonding site.

The residue as referred to herein indicates a structure of a portion in which a functional group subjected to bonding is eliminated from the raw material component. That is, $A^1$ is corresponding to a structure of a portion in which the two maleimide groups which the component (b1) has are eliminated.

The residue represented by $A^1$ is preferably a divalent group represented by the following general formula (2), (3), (4), or (5).

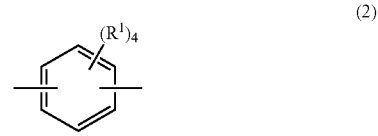

In the formula, $R^1$'s each independently represent a hydrogen atom, an aliphatic hydrocarbon group having 1 to 5 carbon atoms, or a halogen atom.

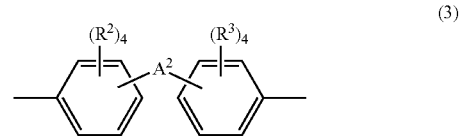

In the formula, $R^2$ and $R^3$ each independently represent a hydrogen atom, an aliphatic hydrocarbon group having 1 to 5 carbon atoms, or a halogen atom; and $A^2$ is an alkylene group or an alkylidene group each having 1 to 5 carbon atoms, an ether group, a sulfide group, a sulfonyl group, a carbonyloxy group, a ketone group, a single bond, or a group represented by the following general formula (3-1).

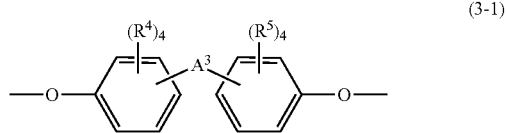

In the formula, $R^4$ and $R^5$ each independently represent a hydrogen atom, an aliphatic hydrocarbon group having 1 to 5 carbon atoms, or a halogen atom; and $A^3$ is an alkylene group having 1 to 5 carbon atoms, an isopropylidene group, an ether group, a sulfide group, a sulfonyl group, a carbonyloxy group, a ketone group, or a single bond.

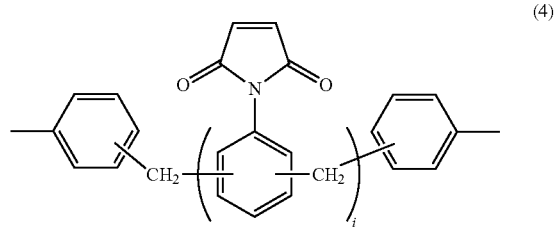

In the formula, i is an integer of 1 to 10.

In the formula, $R^6$ and $R^7$ each independently represent a hydrogen atom or an aliphatic hydrocarbon group having 1 to 5 carbon atoms; and j is an integer of 1 to 8.

Examples of the aliphatic hydrocarbon group having 1 to 5 carbon atoms, which is represented by $R^1$ in the general formula (2), $R^2$ and $R^3$ in the general formula (3), $R^4$ and $R^5$ in the general formula (3-1), and $R^6$ and $R^7$ in the general formula (5), respectively, include a methyl group, an ethyl group, a n-propyl group, an isopropyl group, a n-butyl group, an isobutyl group, a t-butyl group, and a n-pentyl group. The aliphatic hydrocarbon group may be an aliphatic hydrocarbon group having 1 to 3 carbon atoms and may also be a methyl group.

Examples of the alkylene group having 1 to 5 carbon atoms, which is represented by $A^2$ in the general formula (3) and $A^3$ in the general formula (3-1), respectively, include a methylene group, an ethylene group, a propylene group, a butylene group, and a pentylene group.

Examples of the alkylidene group having 1 to 5 carbon atoms, which is represented by $A^2$ in the general formula (3), include an ethylidene group, a propylidene group, an isopropylidene group, a butylidene group, an isobutylidene group, and a pentylidene group.

The diamine compound (b2) (hereinafter also referred to as "component (b2)") is not particularly limited so long as it is a compound having two amino groups. Although the amino group is not particularly limited, it is preferably a primary amino group.

Examples of the component (b2) include 4,4'-diaminodiphenylmethane, 4,4'-diamino-3,3'-dimethyldiphenylmethane, 4,4'-diamino-3,3'-diethyldiphenylmethane, 4,4'-diaminodiphenyl ether, 4,4'-diaminodiphenyl sulfone, 3,3'-diaminodiphenyl sulfone, 4,4'-diaminodiphenyl ketone, 4,4'-diaminobiphenyl, 3,3'-dimethyl-4,4'-diaminobiphenyl, 2,2'-dimethyl-4,4'-diaminobipheny, 3,3'-dihydroxybenzidine, 2,2-bis(3-amino-4-hydroxyphenyl)propane, 3,3'-dimethyl-5,5'-diethyl-4,4'-diphenylmethanediamine, 2,2-bis(4-aminophenyl)propane, 2,2-bis[4-(4-aminophenoxy)phenyl]propane, 1,3-bis(3-aminophenoxy)benzene, 1,3-bis(4-aminophenoxy)benzene, 1,4-bis(4-aminophenoxy)benzene, 4,4'-bis(4-aminophenoxy)biphenyl, 1,3-bis{1-[4-(4-aminophenoxy)phenyl]-1-methylethyl}benzene, 1,4-bis{1-[4-(4-aminophenoxy)phenyl]-1-methylethyl}benzene, 4,4'-[1,3-phenylenebis(1-methylethylidene)]bisaniline, 4,4'-[1,4-phenylenebis(1-methylethylidene)]bisaniline, 3,3'-[1,3-phenylenebis(1-methylethylidene)]bisaniline, bis[4-(4-aminophenoxy)phenyl]sulfone, bis[4-(3-aminophenoxy)phenyl]sulfone, and 9,9-bis(4-aminophenyl)fluorene. These may be used alone, or may be used in combination of two or more thereof.

Of these, 4,4'-diaminodiphenylmethane, 4,4'-diamino-3,3'-dimethyldiphenylmethane, 4,4'-diamino-3,3'-diethyldiphenylmethane, 2,2-bis[4-(4-aminophenoxy)phenyl]propane, 4,4'-[1,3-phenylenebis(1-methylethylidene)]bisaniline, and 4,4'-[1,4-phenylenebis(1-methylethylidene)]bisaniline are preferred from the standpoints that they are high in solubility in an organic solvent and high in a degree of conversion at the time of synthesis and are able to enhance the heat resistance; 3,3'-dimethyl-5,5'-diethyl-4,4'-diphenylmethanebismaleimide is preferred from the standpoint that it is excellent in dielectric characteristics and low in water absorptivity; and 2,2-bis[4-(4-aminophenoxy)phenyl]propane is preferred from the standpoint that it is excellent in mechanical characteristics, such as high adhesion to a conductor, elongation of a cured material, and breaking strength. Furthermore, 4,4'-[1,3-phenylenebis(1-methylethylidene)]bisaniline and 4,4'-[1,4-phenylenebis(1-methylethylidene]bisaniline are more preferred from the standpoint that in addition to the aforementioned standpoint that they are excellent in solubility, a degree of conversion, heat resistance, and high adhesion to a conductor, they are able to reveal high frequency characteristics and low hygroscopicity.

Examples of the structural unit derived from the component (b2) include a group represented by the following general formula (6-1) and a group represented by the following general formula (6-2).

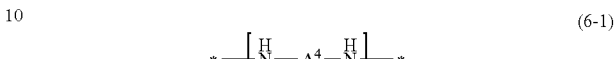

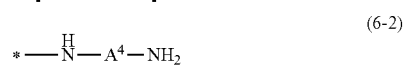

In the general formulae (6-1) and (6-2), $A^4$ represents a residue of the component (b2); and * represents a bonding site.

The residue represented by $A^4$ is preferably a divalent group represented by the following general formula (7).

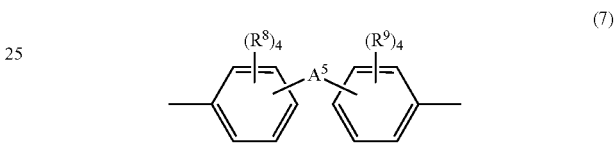

In the formula, $R^8$ and $R^9$ each independently represent a hydrogen atom, an aliphatic hydrocarbon group having 1 to 5 carbon atoms, an alkoxy group having 1 to 5 carbon atoms, a hydroxy group, or a halogen atom; and $A^5$ is an alkylene group or an alkylidene group each having 1 to 5 carbon atoms, an ether group, a sulfide group, a sulfonyl group, a carbonyloxy group, a ketone group, a fluorenylene group, a single bond, or a group represented by the following general formula (7-1) or the following general formula (7-2).

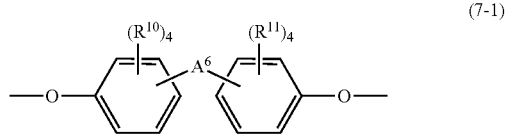

In the formula, $R^{10}$ and $R^{11}$ each independently represent a hydrogen atom, an aliphatic hydrocarbon group having 1 to 5 carbon atoms, or a halogen atom; and $A^6$ is an alkylene group having 1 to 5 carbon atoms, an isopropylidene group, a m- or p-phenylenediisopropylidene group, an ether group, a sulfide group, a sulfonyl group, a carbonyloxy group, a ketone group, or a single bond.

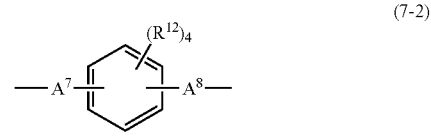

In the formula, $R^{12}$'s each independently represent a hydrogen atom, an aliphatic hydrocarbon group having 1 to 5 carbon atoms, or a halogen atom; and $A^7$ and $A^8$ are each an alkylene group having 1 to 5 carbon atoms, an isopropylidene group, an ether group, a sulfide group, a sulfonyl group, a carbonyloxy group, a ketone group, or a single bond.

The aliphatic hydrocarbon group having 1 to 5 carbon atoms, which is represented by $R^8$ and $R^9$ in the general formula (7), $R^{10}$ and $R^{11}$ in the general formula (7-1), and $R^{12}$ in the general formula (7-2), respectively, is explained in the same way as in the aliphatic hydrocarbon group having 1 to 5 carbon atoms, which is represented by $R^1$ in the general formula (2).

The alkylene group having 1 to 5 carbon atoms, which is represented by $A^5$ in the general formula (7), $A^6$ in the general formula (7-1), and $A^7$ and $A^8$ in the general formula (7-2), respectively, is explained in the same way as in the alkylene group having 1 to 5 carbon atoms, which is represented by $A^2$ in the general formula (3).

The alkylidene group having 1 to 5 carbon atoms, which is represented by $A^5$ in the general formula (7), is explained in the same way as in the alkylidene group having 1 to 5 carbon atoms, which is represented by $A^2$ in the general formula (3).

From the standpoints of solubility in an organic solvent, high frequency characteristics, high adhesion to a conductor, moldability of a film, and so on, it is preferred that the polyimide compound (B1) contains a polyaminobismaleimide compound represented by the following general formula (8).

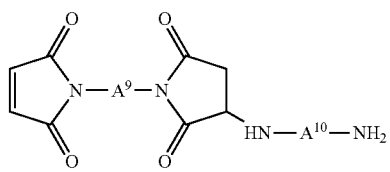

(8)

In the formula, $A^9$ is explained in the same way as in $A^1$ in the general formula (1-1); and $A^{10}$ is explained in the same way as in $A^4$ in the general formula (6-1).

The polyimide compound (B1) can be, for example, produced by allowing the component (b1) and the component (b2) to react with each other.

It is preferred that the reaction between the component (b1) and the component (b2) is performed in an organic solvent. Although the organic solvent is not particularly limited, examples thereof include alcohols, such as methanol, ethanol, butanol, butyl cellosolve, ethylene glycol monomethyl ether, and propylene glycol monomethyl ether; ketones, such as acetone, methyl ethyl ketone, methyl isobutyl ketone, and cyclohexanone; aromatic hydrocarbons, such as toluene, xylene, and mesitylene; esters, such as methoxyethyl acetate, ethoxyethyl acetate, butoxyethyl acetate, and ethyl acetate; and nitrogen-containing compounds, such as N,N-dimethylformamide, N,N-dimethylacetamide, and N-methyl-2-pyrrolidone. These may be used alone, or may be used in combination of two or more thereof. Of these organic solvents, methyl ethylene ketone, cyclohexanone, propylene glycol monomethyl ether, N,N-dimethylformamide, and N,N-dimethylacetamide are preferred from the viewpoint of solubility.

On the occasion of producing the polyimide compound (B1), an equivalent ratio (Ta2/Ta1) between a maleimide group equivalent (Ta1) and an —$NH_2$ group equivalent (Ta2) of the component (b1) is preferably 0.05 to 1.0, and more preferably 0.1 to 0.8. By allowing the component (b1) and the component (b2) to react with each other within the aforementioned range, in the thermosetting resin composition of the present embodiment, excellent high frequency characteristics, heat resistance, flame retardancy, and glass transition temperature are obtained.

On the occasion of allowing the component (b1) and the component (b2) to react with each other, a reaction catalyst can also be used, as the need arises. Although the reaction catalyst is not particularly limited, examples thereof include acidic catalysts, such as p-toluenesulfonic acid; amines, such as triethylamine, pyridine, and tributylamine; imidazoles, such as methyl imidazole and phenyl imidazole; and phosphorus-based catalysts, such as triphenylphosphine. These may be used alone, or may be used in combination of two or more thereof. In the case of using the reaction catalyst, though its use amount is not particularly limited, for example, the reaction catalyst can be used in an amount ranging from 0.01 to 5.0% by mass relative to the total mass of the component (b1) and the component (b2).

The polyimide compound (B1) is, for example, obtained by charging predetermined amounts of the component (b1), the component (b2), and the organic solvent, and optionally, the reaction catalyst, etc. in a synthesis reactor and performing the Michael addition reaction. Although the reaction condition in this step is not particularly limited, for example, from the viewpoints of workability, such as a reaction rate, gelation suppression, and so on, it is preferred to perform the reaction in a range such that a reaction temperature is 50 to 160° C., and a reaction time is 1 to 10 hours.

In this step, a solid content concentration of the reaction raw materials and a solution viscosity can be regulated by addition of the aforementioned organic solvent or concentration. Although the solid content concentration of the reaction raw materials is not particularly limited, for example, it is preferably 10 to 90% by mass, and more preferably 20 to 80% by mass. When the solid content concentration of the reaction raw materials is 10% by mass or more, the reaction rate does not become excessively slow, so that such is advantageous from the standpoint of production costs. In addition, in the case where the solid content concentration of the reaction raw materials is 90% by mass or less, excellent solubility is obtained, stirring efficiency is excellent, and gelation is scarcely caused.

After producing the polyimide compound (B1), the concentration may be performed after removal of a part or the whole of the organic solvent, or the dilution can be performed by adding an organic solvent, in conformity with the purpose. As the organic solvent which is additionally used, the organic solvents exemplified in the explanation of the production method of the polyimide compound (B1) are applicable. These may be used alone, or may be used in combination of two or more thereof. Of these, methyl ethyl ketone, cyclohexanone, propylene glycol monomethyl ether, N,N-dimethylformamide, and N,N-dimethylacetamide are preferred from the viewpoint of solubility.

Although a weight average molecular weight of the polyimide compound (B1) is not particularly limited, for example, it is preferably 500 to 6,000, more preferably 1,000 to 5,000, and still more preferably 1,500 to 4,000. As for the weight average molecular weight of the polyimide compound (B1), the measurement method described in the section of Examples can be applied.

The content of the thermosetting resin (B) in the thermosetting resin composition of the present embodiment is preferably 20 to 95% by mass, more preferably 40 to 90% by mass, and still more preferably 65 to 85% by mass of the total mass of all of the resin components contained in the thermosetting resin composition of the present embodiment.

<Elastomer (C)>

Although the elastomer (C) is not particularly limited, examples thereof include a polybutadiene-based elastomer, a styrene-based elastomer, an olefin-based elastomer, a urethane-based elastomer, a polyester-based elastomer, a polyamide-based elastomer, an acrylic elastomer, a silicone-based elastomer, and derivatives of these elastomers. These can be used alone, or can be used in combination of two or more thereof.

As the elastomer (C), one having a reactive functional group at a molecular end or in a molecular chain can be used. As for the reactive functional group, for example, at least one selected from the group consisting of an acid anhydride group, an epoxy group, a hydroxy group, a carboxy group, an amino group, an amide group, an isocyanate group, an acryl group, a methacryl group, and a vinyl group is preferred; from the standpoint of adhesive properties to a metal foil, at least one selected from an acid anhydride group, an epoxy group, a hydroxy group, a carboxy group, an amino group, and an amide group is more preferred; from the standpoint of dielectric characteristics, an acid anhydride group is still more preferred; and a maleic anhydride group is especially preferred. When the elastomer (C) has such a reactive functional group, there is a tendency that compatibility with the resin is improved, and that on the occasion of forming an interlayer insulating layer, the separation between the inorganic filler and the resin components is suppressed. From the same viewpoint, the elastomer (C) is preferably an elastomer modified with an acid anhydride, and more preferably an elastomer modified with maleic anhydride.

As the polybutadiene-based elastomer, there are suitably exemplified structures including a 1,2-vinyl group and composed of a 1,4-trans body and a 1,4-cis body.

As the polybutadiene-based elastomer, from the viewpoints that compatibility with the resin is improved, and that on the occasion of forming an interlayer insulating layer, the separation between the inorganic filler and the resin components is suppressed, one having a reactive functional group is preferred, and a polybutadiene-based elastomer modified with an acid anhydride is especially preferred. Although the acid anhydride is not particularly limited, examples thereof include phthalic anhydride, maleic anhydride, trimellitic anhydride, pyromellitic anhydride, hexahydrophthalic anhydride, tetrahydrophthalic anhydride, methylnadic anhydride, nadic anhydride, glutaric anhydride, dimethylglutaric anhydride, diethylglutaric anhydride, succinic anhydride, methylhexahydrophthalic anhydride, and methyltetrahydrophthalic anhydride. Of these, maleic anhydride is preferred.

In the case where the elastomer (C) is modified with an acid anhydride, the number of an acid anhydride-derived group contained in one molecule of the elastomer (C) (hereinafter also referred to as "acid anhydride group") is preferably 1 to 10, more preferably 1 to 6, and still more preferably 2 to 5. When the number of the acid anhydride group is 1 or more in one molecule, there is a tendency that on the occasion of forming an interlayer insulating layer, the separation between the inorganic filler and the resin components is more suppressed. In addition, when the number of the acid anhydride group is 10 or less in one molecule, there is a tendency that the dielectric tangent of the thermosetting resin composition becomes lower. In the case where the elastomer (C) is modified with maleic anhydride, from the same viewpoint as mentioned above, the number of a maleic anhydride-derived group contained in one molecule of the elastomer (C) is preferably 1 to 10, more preferably 1 to 6, and still more preferably 2 to 5.

As the styrene-based elastomer, for example, there are suitably exemplified a styrene-butadiene-styrene block copolymer, a styrene-isoprene-styrene block copolymer, a styrene-ethylene-butylene-styrene block copolymer, and a styrene-ethylene-propylene-styrene block copolymer.

Examples of the olefin-based elastomer include copolymers of an α-olefin having 2 to 20 carbon atoms, such as ethylene, propylene, 1-butene, 1-hexene, and 4-methyl-pentene, and suitably, examples thereof include an ethylene-propylene copolymer (EPR) and an ethylene-propylene-diene copolymer (EPDM).

As the urethane-based elastomer, for example, there are suitably exemplified ones containing a hard segment composed of a short-chain diol and a diisocyanate and a soft segment composed of a polymeric (long-chain) diol and a diisocyanate.

Examples of the polyester-based elastomer include ones obtained by polycondensing a dicarboxylic acid or a derivative thereof with a diol compound or a derivative thereof.

Specific examples of the dicarboxylic acid include aromatic dicarboxylic acids, such as terephthalic acid, isophthalic acid, and naphthalenedicarboxylic acid, and aromatic dicarboxylic acids in which a hydrogen atom of an aromatic nucleus of such an aromatic dicarboxylic acid is substituted with a methyl group, an ethyl group, a phenyl group, etc.; aliphatic dicarboxylic acids having 2 to 20 carbon atoms, such as adipic acid, sebacic acid, and dodecanedicarboxylic acid; and alicyclic dicarboxylic acids, such as cyclohexanedicarboxylic acid. These compounds may be used alone, or may be used in combination of two or more thereof.

Specific examples of the diol compound include aliphatic diols, such as ethylene glycol, 1,3-propanediol, 1,4-butanediol, 1,6-hexanediol, and 1,10-decanediol; alicyclic diols, such as 1,4-cyclohexanediol; and aromatic diols, such as bisphenol A, bis(4-hydroxyphenyl)methane, bis(4-hydroxy-3-methylphenyl)propane, and resorcin. These compounds can be used alone, or can be used in combination of two or more thereof.

As the polyester-based elastomer, there are suitably exemplified multi-block copolymers in which an aromatic polyester (for example, polybutylene terephthalate) moiety constitutes a hard segment component, and an aliphatic polyester (for example, polytetramethylene glycol) constitutes a soft segment component. The multi-block copolymer includes various grades according to differences in kind, ratio, and molecular weight of the hard segment and the soft segment. Specific examples thereof include "HYTREL (registered trademark)" (manufactured by Du Pont-Toray Co., Ltd.), "PELPRENE (registered trademark)" (manufactured by Toyobo Co., Ltd.), and "ESPEL (registered trademark)" (manufactured by Hitachi Chemical Company, Ltd.).

Examples of the polyamide-based elastomer include block copolymers in which the hard segment component is constituted of a polyamide, and the soft segment component is constituted of polybutadiene, a butadiene-acrylonitrile copolymer, a styrene-butadiene copolymer, polyisoprene, an ethylene-propylene copolymer, a polyether, a polyester, polybutadiene, a polycarbonate, a polyacrylate, a polymethacrylate, a polyurethane, a silicone rubber, etc.

Examples of the acrylic elastomer include polymers of a raw material monomer containing, as a main component, an acrylic acid ester. As the acrylic acid ester, there are suitably exemplified ethyl acrylate, butyl acrylate, methoxyethyl acrylate, and ethoxyethyl acrylate. In addition, those in which glycidyl methacrylate, allyl glycidyl ether, etc. is copolymerized as a crosslinking-site monomer may be used, and those in which acrylonitrile, ethylene, etc. is copolymerized may also be used.

The silicone-based elastomer is an elastomer containing, as a main component, an organopolysiloxane, and for example, it is classified into a polydimethylsiloxane-based elastomer, a polymethylphenylsiloxane-based elastomer, and a polydiphenylsiloxane-based elastomer.

Of these elastomers, from the standpoints of heat resistance and insulation reliability, a styrene-based elastomer, a polybutadiene-based elastomer, an olefin-based elastomer, a polyamide-based elastomer, and a silicone-based elastomer are preferred; from the standpoint of dielectric characteristics, a polybutadiene-based elastomer and a styrene-based elastomer are more preferred.

A weight average molecular weight of the elastomer (C) is preferably 500 to 50,000, more preferably 1,000 to 30,000, and still more preferably 1,500 to 10,000. When the weight average molecular weight of the elastomer (C) is 500 or more, there is a tendency that the curing properties of the resulting thermosetting resin composition and the dielectric characteristics of a cured material become more excellent. In addition, when the weight average molecular weight of the elastomer (C) is 50,000 or less, on the occasion of forming an interlayer insulating layer, there is a tendency that the separation between the inorganic filler and the resin components is suppressed. As for the weight average molecular weight of the elastomer (C), the measurement method of the weight average molecular weight of the polyimide compound (B1) described in the section of Examples can be applied.

Although the content of the elastomer (C) is not particularly limited, it is preferably 1 to 70% by mass, more preferably 5 to 50% by mass, and still more preferably 10 to 30% by mass of the total mass of all of the resin components contained in the thermosetting resin composition of the present embodiment. By allowing the content of the elastomer (C) to fall within the aforementioned range, there is a tendency that the dielectric tangent is low, that on the occasion of forming a film, the handling properties are excellent, and that the separation of the resin of the resulting interlayer insulation layer is not generated.

Although the total content of the thermosetting resin (B) and the elastomer (C) in the thermosetting resin composition of the present embodiment is not particularly limited, it is preferably 50% by mass or more, more preferably 60% by mass or more, and still more preferably 70% by mass or more in the total mass of all of the resin components contained in the thermosetting resin composition of the present embodiment. Although an upper limit of the content is not particularly limited, it may be 100% by mass.

<Minimum Melt Viscosity>

The minimum melt viscosity of the thermosetting resin composition of the present embodiment is preferably 300 to 1,500 Pa·s, and more preferably 400 to 1,000 Pa·s from the viewpoint that in a step of laminating press, the thermosetting resin composition is melted, solidified, and appropriately adhered. The minimum melt viscosity can be measured by the method described in the section of Examples.

<Flame Retardant, Curing Accelerator, Etc.>

The thermosetting resin composition of the present embodiment may contain a flame retardant, a curing accelerator, and so on, as the need arises.

When a flame retardant is contained in the thermosetting resin composition of the present embodiment, more excellent flame retardancy can be imparted. The flame retardant is not particularly limited, and examples thereof include a chlorine-based flame retardant, a bromine-based flame retardant, a phosphorus-based flame retardant, and a metal hydrate-based flame retardant. From the standpoint of compatibility with the environment, a phosphorus-based flame retardant or a metal hydrate-based flame retardant is preferred.

When the thermosetting resin composition of the present embodiment contains an appropriate curing accelerator, the curability of the thermosetting resin composition is improved, whereby the dielectric characteristics, heat resistance, high elastic modulus, glass transition temperature, and so on of the interlayer insulating layer can be more improved. The curing accelerator is not particularly limited, and examples thereof include various imidazole compounds and derivatives thereof; various tertiary amine compounds; various quaternary ammonium compounds; and various phosphorus-based compounds, such as triphenylphosphine.

The thermosetting resin composition of the present embodiment may contain, in addition to those mentioned above, additives, such as an antioxidant and a fluidity controlling agent.

<Elastic Modulus>

From the viewpoint of reducing the amount of warpage at the time of mounting, the elastic modulus of a cured material of the thermosetting resin composition of the present embodiment is preferably 8.0 to 12.0 GPa, more preferably 8.0 to 11.5 GPa, and still more preferably 8.0 to 11.0 GPa.

The elastic modulus of a cured material is a value of a storage elastic modulus (E') at 40° C. as measured under a condition in a measuring temperature region of 40 to 300° C. and at a temperature rise rate of 5° C./min and an excitation frequency of 10 Hz using a wide-range dynamic viscoelasticity measuring device (a trade name: DVE-V4, manufactured by Rheology Co., Ltd.).

The cured material to be subjected to the measurement of elastic modulus is one obtained by curing the thermosetting resin composition of the present embodiment in air at preferably 160 to 220° C., more preferably 170 to 210° C., and still more preferably 180 to 200° C. for preferably 60 to 300 minutes, more preferably 120 to 240 minutes, and still more preferably 150 to 210 minutes.

[Resin Film for Interlayer Insulation]

The resin film for interlayer insulation of the present embodiment is one including the thermosetting resin composition of the present embodiment.

The resin film for interlayer insulation of the present embodiment may also be one in which a support is provided on either one surface thereof.

Examples of the support include films of polyolefins, such as polyethylene, polypropylene, and polyvinyl chloride; films of polyesters, such as polyethylene terephthalate (hereinafter also referred to as "PET") and polyethylene naphthalate; and various plastic films, such as a polycarbonate film and a polyimide film. In addition, a metal foil, such as a copper foil and an aluminum foil, a release paper, and so on may also be used. The support and a protective film as mentioned later may be ones having been subjected to a surface treatment, such as a matting treatment and a corona treatment. In addition, the support and a protective film as mentioned later may also be ones having been subjected to a release treatment with a silicone resin-based release agent, an alkyd resin-based release agent, a fluorine resin-based release agent, or the like.

Although the thickness of the support is not particularly limited, it is preferably 10 to 150 μm, and more preferably 25 to 50 μm.

Although the resin film for interlayer insulation of the present embodiment is not particularly limited with respect to applications, it can be used over a wide range of application in which an interlayer insulating layer is considered to be needed, inclusive of an insulating resin sheet, such as an adhesive film and a prepreg, a circuit board, a solder resist, an underfill material, a die bonding material, a semiconductor sealing material, a hole plugging resin, and a module-embedding resin. Among these, it can be suitably used for forming an interlayer insulating layer in the production of a printed wiring board.

Next, a production method of the resin film for interlayer insulation of the present embodiment is explained.

<Production Method of Resin Film for Interlayer Insulation>

The resin film for interlayer insulation of the present embodiment can be, for example, produced in the following manner.

On the occasion of producing the resin film for interlayer insulation, it is preferred that first of all, the inorganic filler, the thermosetting resin (B), and the elastomer (C), and optionally used other components are dissolved or dispersed in an organic solvent, thereby rendering the resultant in a state of a resin varnish (hereinafter also referred to as "varnish for resin film for interlayer insulation").

Examples of the organic solvent which is used for the production of the varnish for resin film for interlayer insulation include a ketone, an acetic acid ester, an ethylene glycol monoalkyl ether, a diethylene glycol monoalkyl ether, a propylene glycol monoalkyl ether, toluene, xylene, dimethylformamide, dimethylacetamide, and N-methylpyrrolidone. These organic solvents may be used alone or in combination of two or more thereof.

The blending amount of the organic solvent is preferably 10 to 60% by mass, and more preferably 10 to 35% by mass relative to the whole mass of the varnish for resin film for interlayer insulation.

The resin film for interlayer insulation is obtained by coating the thus produced varnish for resin film for interlayer insulation on the aforementioned support, followed by heating for drying.

As for a method of coating the varnish for resin film for interlayer insulation on the support, for example, a coating device, such as a comma coater, a bar coater, a kiss coater, a roll coater, a gravure coater, and a die coater, can be used. It is preferred that such a coating device is properly selected according to the film thickness.

Although a drying condition after coating is not particularly limited, for example, in the case of a varnish for resin film for interlayer insulation containing 30 to 60% by mass of an organic solvent, the resin film for interlayer insulation can be suitably formed by drying at 50 to 150° C. for approximately 2 to 10 minutes. The varnish is dried in such a manner that the content of a volatile component (mainly the organic solvent) in the resin film for interlayer insulation after drying is preferably 10% by mass or less, and more preferably 6% by mass or less.

In the case of using the resin film for interlayer insulation of the present embodiment when disposed on a conductor layer, from the viewpoint of embedding the conductor layer of a circuit board, its thickness is preferably the thickness of the conductor layer of the circuit board or more. Specifically, since the thickness of the conductor layer which the circuit board has is typically in a range of 5 to 70 μm, the thickness of the resin film for interlayer insulation is preferably 5 to 100 μm.

A protective film may be provided on a surface of the resin film for interlayer insulation formed on the support, on the side opposite to the support. Although the thickness of the protective film is not particularly limited, for example, it is 1 to 40 μm. By laminating the protective film, attachment of a dust, etc. and scratch on the surface of the resin film for interlayer insulation can be prevented from occurring. The resin film for interlayer insulation can be stored upon being wound up in a roll state.

[Composite Film]

The composite film of the present embodiment is a composite film including a first resin layer including the thermosetting resin composition of the present embodiment and a second resin layer.

An example of the composite film of the present embodiment is shown as a schematic cross-sectional view in FIG. 1. The composite film according to the present embodiment includes a first resin layer 1 and a second resin layer 2, and optionally, a support 3 and/or a protective film 4.

A distinct interface does not exist between the first resin layer 1 and the second resin layer 2, and for example, a part of the constituent components of the first resin layer 1 and a part of the constituent components of the second resin layer 2 may be present in a compatibilized and/or mixed state.

<First Resin Layer>

The first resin layer 1 is one including the thermosetting resin composition of the present embodiment. That is, the first resin layer 1 includes at least one selected from the group consisting of the first thermosetting resin composition and the second thermosetting resin composition according to the present embodiment.

For example, in the case of producing a multi-layered printed wiring board using the composite film of the present embodiment, the first resin layer 1 is provided between a circuit board and an adhesive auxiliary layer and used for the purpose of insulating a conductor layer of the circuit board from a layer provided thereon. In addition, in the case where a through-hole, a via hole, or the like is present in the circuit board, the first resin layer 1 also flows thereinto, to play a role for filling the inside of the hole.

<Second Resin Layer>

In a printed wiring board of the present embodiment as mentioned later, the second resin layer 2 is positioned between a cured material of the first resin layer including the thermosetting resin composition of the present embodiment and a conductor layer and provided for the purpose of improving the adhesion to the conductor layer. By providing the second resin layer, not only a smooth surface is obtained, but also more excellent adhesive strength to the conductor layer to be formed by means of plating is obtained. In consequence, from the viewpoint of forming a fine wiring, it is preferred to provide the second resin layer 2.

The second resin layer 2 is not particularly limited so long as it may improve the adhesion to the conductor layer. However, for example, from the viewpoint that not only even if the surface roughness is small, the adhesion to plated copper is excellent, but also an interlayer insulating layer with a low dielectric tangent is obtained, it is preferred that the second resin layer 2 includes a thermosetting resin composition for second resin layer containing a polyfunctional epoxy resin (D), an active ester curing agent (E), and a phenolic hydroxy group-containing polybutadiene-modified polyamide resin (F) (hereinafter also referred to as "component (F)") (the thermosetting resin composition for second resin layer will be hereinafter also referred to as "third thermosetting resin composition").

<Polyfunctional Epoxy Resin (D)>

Although the polyfunctional epoxy resin (D) is not particularly limited so long as it is a resin having two or more epoxy groups, examples thereof include a bisphenol A type epoxy resin, a bisphenol F type epoxy resin, a bisphenol S type epoxy resin, a cresol novolak type epoxy resin, a phenol novolak type epoxy resin, a biphenyl type epoxy resin, a naphthol type epoxy resin, an anthracene type epoxy resin, a dicyclopentadiene type epoxy resin, a naphthalene type epoxy resin, an aralkyl novolak type epoxy resin, a fluorene type epoxy resin, and a xanthene type epoxy resin. From the viewpoint of adhesion to plated copper, the polyfunctional epoxy resin (D) is preferably one having a biphenyl structure is preferred, and more preferably an aralkyl novolak type epoxy resin having a biphenyl structure.

As the polyfunctional epoxy resin (D), a commercially available product may be used.

The polyfunctional epoxy resin (D) may be used alone, or may be used in combination of two or more thereof.

Although an epoxy equivalent of the polyfunctional epoxy resin (D) is not particularly limited, from the viewpoint of adhesion, it is preferably 150 to 450 g/mol, more preferably 200 to 400 g/mol, and still more preferably 250 to 350 g/mol.

Although the content of the polyfunctional epoxy resin (D) in the third thermosetting resin composition is not particularly limited, it is preferably 10 to 90% by mass, more preferably 20 to 80% by mass, and still more preferably 30 to 70% by mass relative to the total mass of all of the resin components contained in the third thermosetting resin composition. When the content of the polyfunctional epoxy resin (D) is 10% by mass or more, there is a tendency that more excellent adhesive strength to plated copper is obtained, whereas when it is 90% by mass or less, a lower dielectric tangent is obtained.

<Active Ester Curing Agent (E)>

The active ester curing agent (E) refers to one having one or more ester groups in one molecule and having a curing action of the epoxy resin.

Although the active ester curing agent (E) is not particularly limited, examples thereof include ester compounds obtained from an aliphatic or aromatic carboxylic acid and an aliphatic or aromatic hydroxy compound. Of these, as for an ester compound obtained from an aliphatic carboxylic acid, an aliphatic hydroxy compound, or the like, in view of the fact that it contains an aliphatic chain, there is a tendency that solubility in an organic solvent and compatibility with the epoxy resin can be enhanced. In addition, as for an ester compound obtained from an aromatic carboxylic acid, an aromatic hydroxy compound, or the like, in view of the fact that it has an aromatic ring, there is a tendency that the heat resistance is enhanced.

Examples of the active ester curing agent (E) include a phenol ester compound, a thiophenol ester compound, an N-hydroxyamine ester compound, and an esterified compound of a heterocyclic hydroxy compound.

More specifically, examples thereof include aromatic esters obtained through a condensation reaction between an aromatic carboxylic acid and a phenolic hydroxy group. Aromatic esters obtained through a condensation reaction between an aromatic carboxylic acid and a phenolic hydroxy group by using, as a raw material, a mixture of an aromatic carboxylic acid component selected from a material obtained by substituting 2 to 4 hydrogen atoms of an aromatic ring of benzene, naphthalene, biphenyl, diphenylpropane, diphenylmethane, diphenyl ether, diphenyl sulfonic acid, or the like with a carboxy group, a monovalent phenol obtained by substituting one hydrogen atom of the aforementioned aromatic ring with a hydroxy group, and a polyhydric phenol obtained by substituting 2 to 4 hydrogen atoms of an aromatic ring with a hydroxy group, and the like are preferred. That is, an aromatic ester having the aforementioned structural unit derived from an aromatic carboxylic acid component, the aforementioned structural unit derived from a monovalent phenol, and the aforementioned structural unit derived from a polyhydric phenol is preferred.

As the active ester curing agent (E), a commercially available product may be used.

The active ester curing agent (E) may be used alone, or may be used in combination of two or more thereof.

Although an ester equivalent of the active ester curing agent (E) is not particularly limited, it is preferably 150 to 400 g/mol, more preferably 170 to 300 g/mol, and still more preferably 200 to 250 g/mol.

An equivalent ratio ((ester group)/(epoxy group)) of an ester group of the active ester curing agent (E) to an epoxy group of the polyfunctional epoxy resin (D) in the third thermosetting resin composition is preferably 0.05 to 1.5, more preferably 0.1 to 1.3, and still more preferably 0.2 to 1.0. When the equivalent ratio ((ester group)/(epoxy group)) falls within the aforementioned range, not only the adhesive strength to plated copper is more enhanced, but also a lower dielectric tangent and a smooth surface are obtained, and hence, such is suitable from the viewpoint of forming a fine wiring.

<Phenolic Hydroxy Group-Containing Polybutadiene-Modified Polyamide Resin (F)>

Although the component (F) is not particularly limited so long as it is a phenolic hydroxy group-containing polybutadiene-modified polyamide resin, those having a structural unit derived from a diamine, a structural unit derived from a phenolic hydroxy group-containing dicarboxylic acid, a structural unit derived from a phenolic hydroxy group-free dicarboxylic acid, and a structural unit derived from a polybutadiene having a carboxy group at the both ends thereof are preferred. Specifically, those having a structural unit represented by the following general formula (i), a structural unit represented by the following general formula (ii), and a structural unit represented by the following general formula (iii) are preferably exemplified.

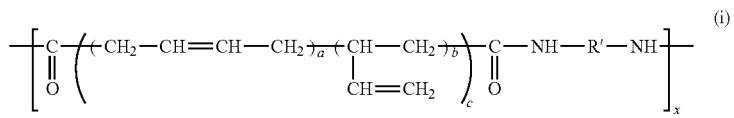

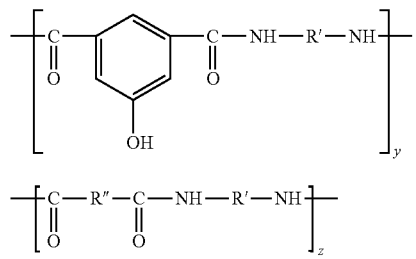

(ii)

(iii)

In the general formulae (i) to (iii), a, b, c, x, y, and z are each an integer expressing an average degree of polymerization; a=2 to 10; b=0 to 3; c=3 to 30; when x=1, then (y+z)=2 to 300 ((y+z)/x); and when y=1, then z≥20 (z/y).

In the general formulae (i) to (iii), R's each independently represent a divalent group derived from an aromatic diamine or an aliphatic diamine; and in the general formula (iii), R" represents a divalent group derived from an aromatic dicarboxylic acid, an aliphatic dicarboxylic acid, or an oligomer having a carboxy group at the both ends thereof.

The plural R's contained in the general formulae (i) to (iii) may be the same as or different from each other. In addition, when z is an integer of 2 or more, the plural R"s may be the same as or different from each other.

In the general formulae (i) to (iii), specifically, it is preferred that R' is a divalent group derived from an aromatic diamine or an aliphatic diamine as mentioned later; and R" is a divalent group derived from an aromatic dicarboxylic acid, an aliphatic dicarboxylic acid, or an oligomer having a carboxy group at the both ends thereof as mentioned later.

Examples of the diamine which is used for forming the structural unit derived from a diamine in the component (F) include an aromatic diamine and an aliphatic diamine.

Examples of the aromatic diamine include diaminobenzene, diaminotoluene, diaminophenol, diaminodimethylbenzene, diaminomesitylene, diaminonitrobenzene, diaminodiazobenzene, diaminonaphthalene, diaminobiphenyl, diaminodimethoxybiphenyl, diaminodiphenyl ether, diaminodimethyldiphenyl ether, methylenediamine, methylenebis(dimethylaniline), methylenebis(methoxyaniline), methylenebis(dimethoxyaniline), methylenebis(ethylaniline), methylenebis(diethylaniline), methylenebis(ethoxyaniline), methylenebis(diethoxyaniline), isopropylidenedianiline, diaminobenzophenone, diaminodimethylbenzophenone, diaminoanthraquinone, diaminodiphenyl thioether, diaminodimethyldiphenyl thioether, diaminodiphenylsulfone, diaminodiphenyl sulfoxide, and diaminofluorene.

Examples of the aliphatic diamine include ethylenediamine, propanediamine, hydroxypropanediamine, butanediamine, heptanediamine, hexanediamine, cyclopentanediamine, cyclohexanediamine, azapentanediamine, and triazaundecadiamine.

Examples of the phenolic hydroxy group-containing dicarboxylic acid which is used for forming the structural unit derived from a phenolic hydroxy group-containing dicarboxylic acid in the component (F) has include hydroxyisophthalic acid, hydroxyphthalic acid, hydroxyterephthalic acid, dihydroxyisophthalic acid, and dihydroxyterephthalic acid.

Examples of the phenolic hydroxy group-free dicarboxylic acid which is used for forming the structural unit derived from a phenolic hydroxy group-free dicarboxylic acid in the component (F) include an aromatic dicarboxylic acid, an aliphatic dicarboxylic acid, and an oligomer having a carboxy group at the both ends thereof.

Examples of the aromatic dicarboxylic acid include phthalic acid, isophthalic acid, terephthalic acid, biphenyldicarboxylic acid, methylenedibenzoic acid, thiodibenzoic acid, carbonyldibenzoic acid, sulfonylbenzoic acid, and naphthalenedicarboxylic acid.

Examples of the aliphatic dicarboxylic acid include oxalic acid, malonic acid, methylmalonic acid, succinic acid, glutaric acid, adipic acid, maleic acid, fumaric acid, malic acid, tartaric acid, (meth)acryloyloxysuccinic acid, di(meth)acryloyloxysuccinic acid, (meth)acryloyloxymalic acid, (meth)acrylamidosuccinic acid, and (meth)acrylamidomalic acid.

As for the polybutadiene having a carboxy group at the both ends thereof, which is used for forming a structural unit derived from a polybutadiene having a carboxy group at the both ends thereof in the component (F), for example, its number average molecular weight is preferably 200 to 10,000, and an oligomer having a number average molecular weight of 500 to 5,000 is more preferred.

Although a weight average molecular weight of the component (F) is not particularly limited, for example, it is preferably 60,000 to 250,000, and more preferably 80,000 to 200,000. The weight average molecular weight of the component (F) can be determined by the same method as in the weight average molecular weight of the polyimide compound (B1).

Although an active hydroxy group equivalent of the component (F) is not particularly limited, it is preferably 1,500 to 7,000 g/mol, more preferably 2,000 to 6,000 g/mol, and still more preferably 3,000 to 5,000 g/mol.

The component (F) is, for example, synthesized by allowing a diamine, a phenolic hydroxy group-containing dicarboxylic acid, a phenolic hydroxy group-free dicarboxylic acid, and a polybutadiene having a carboxy group at the both ends thereof to react with each other in an organic solvent, such as dimethylacetamide, in the presence of, as catalysts, a phosphorous acid ester and a pyridine derivative, thereby polycondensating the carboxy group and the amino group. As the respective compounds which can be used for the production, those mentioned above can be exemplified.

Although the content of the component (F) in the third thermosetting resin composition is not particularly limited, it is preferably 1 to 20% by mass, more preferably 2 to 15% by mass, and still more preferably 3 to 10% by mass in the total mass of all of the resin components contained in the third thermosetting resin composition. When the content of the component (F) is 1% by mass or more, the toughness of the resin composition can be enhanced, a minute roughened shape is obtained, and the adhesion to plated copper can be enhanced. In addition, when it is 20% by mass or less, the heat resistance is not deteriorated, and deterioration of the resistance to the chemical liquid at the time of a roughening step can be prevented from occurring. In addition, sufficient adhesion to the plated copper can be secured.

<Phosphorus-Based Curing Accelerator (G)>

It is preferred that the third thermosetting resin composition further contains a phosphorus-based curing accelerator (G).

The phosphorus-based curing accelerator (G) can be used without particular limitations so long as it is a curing accelerator containing a phosphorus atom and capable of accelerating the reaction between the polyfunctional epoxy resin (D) and the active ester curing agent (E).

When the third thermosetting resin composition contains the phosphorus-based curing accelerator (G), the curing reaction can be much more sufficiently advanced. As for this reason, it may be assumed that by using the phosphorus-based curing accelerator (G), electron-withdrawing properties of the carbonyl group in the active ester curing agent (E) can be enhanced, whereby the reaction between the active ester curing agent (E) and the polyfunctional epoxy resin (D) is accelerated.

In this way, in view of the fact that the third thermosetting resin composition contains the phosphorus-based curing accelerator (G), it may be considered that as compared with the case of using other curing accelerator, the curing reaction between the polyfunctional epoxy resin (D) and the active ester curing agent (E) is much more sufficiently advanced, so that when combined with the first resin layer, a low dielectric tangent is obtained.

Examples of the phosphorus-based curing accelerator (G) include organic phosphines, such as triphenylphosphine, a diphenyl(alkylphenyl)phosphine, a tris(alkylphenyl)phosphine, a tris(alkoxyphenyl)phosphine, a tris(alkylalkoxyphenyl)phosphine, a tris(dialkylphenyl)phosphine, a tris(trialkylphenyl)phosphine, a tris(tetraalkylphenyl)phosphine, a tris(dialkoxyphenyl)phosphine, a tris(trialkoxyphenyl)phosphine, a tris(tetraalkoxyphenyl)phosphine, a trialkylphosphine, a dialkylarylphosphine, and an alkyldiarylphosphine; complexes between an organic phosphine and an organic boron compound; and adducts between a tertiary phosphine and a quinone. From the viewpoint that the curing reaction is more sufficiently advanced, whereby high adhesion to plated copper can be exhibited, adducts between a tertiary phosphine and a quinone are preferred.

Although the tertiary phosphine is not particularly limited, examples thereof include tri-n-butylphosphine, dibutylphenylphosphine, butyldiphenylphosphine, ethyldiphenylphosphine, triphenylphosphine, tris(4-methylphenyl)phosphine, and tris(4-methoxyphenyl)phosphine. In addition, examples of the quinone include o-benzoquinone, p-benzoquinone, diphenoquinone, 1,4-naphthoquinone, and anthraquinone. Of these, an adduct between tri-n-butylphosphine and p-benzoquinone is more preferred from the standpoints of adhesion to plated copper and heat resistance as well as the matter that a smooth surface is obtained.

Examples of a production method of an adduct between a tertiary phosphine and a quinone include a method in which both the tertiary phosphine and the quinone serving as the raw materials are stirred and mixed in a solvent in which the both are soluble, to undergo an addition reaction, followed by isolation. In this case, as for a production condition, for example, it is preferred that the tertiary phosphine and the quinone are stirred in a solvent, such as a ketone, e.g., methyl isobutyl ketone, methyl ethyl ketone, and acetone, at a temperature ranging from 20 to 80° C. for 1 to 12 hours, to undergo an addition reaction.

The phosphorus-based curing accelerator (G) may be used alone, or may be used in combination of two or more thereof. In addition, one or more curing accelerators other than the phosphorus-based curing accelerator (G) may also be jointly used.

Although the content of the phosphorus-based curing accelerator (G) in the third thermosetting resin composition is not particularly limited, it is preferably 0.1 to 20% by mass, more preferably 0.2 to 15% by mass, and still more preferably 0.4 to 10% by mass in the total mass of all of the resin components contained in the third thermosetting resin composition. When the content of the phosphorus-based curing accelerator (G) is 0.1% by mass or more, the curing reaction can be sufficiently advanced, whereas when it is 20% by mass or less, homogeneity of the cured material can be kept.

<Filler (H)>

The third thermosetting resin composition may contain a filler (H). Examples of the filler (H) include an inorganic filler and an organic filler.

When the filler (H) is contained, scattering of the resin on the occasion of subjecting the second resin layer to laser processing can be more reduced.

Although the inorganic filler is not particularly limited, for example, the same materials exemplified for the inorganic fillers (A1) and (A2) can be used.

From the viewpoint of forming a fine wiring on the second resin layer, a specific surface area of the inorganic filler is preferably 20 m$^2$/g or more, and more preferably 50 m$^2$/g or more. Although an upper limit of the specific surface area is not particularly limited, from the viewpoint of easiness of availability, it is preferably 500 m$^2$/g or less, and more preferably 200 m$^2$/g or less.

The specific surface area can be determined by the BET method based on physical adsorption of an inactive gas at low temperature and low humidity. Specifically, a molecule whose absorption occupied area is already-known is adsorbed on the surface of a powder particle at a liquid nitrogen temperature, and the specific surface area of the powder particle can be determined from the adsorption amount.

As the inorganic filler having a specific surface area of 20 m$^2$/g or more, a commercially available product may be used. In addition, from the viewpoint of improving the humidity resistance, the inorganic filler is preferably an inorganic filler having been subjected to a surface treatment with a surface treating agent, such as a silane coupling agent.

The content of the inorganic filler in the third thermosetting resin composition is preferably 1 to 30% by mass, more preferably 2 to 25% by mass, still more preferably 3 to 20% by mass, and especially preferably 5 to 20% by mass in the solid content of the third thermosetting resin composition. When the content of the inorganic filler is 1% by mass or more, there is a tendency that more excellent laser processability is obtained, whereas when it is 30% by mass or less, there is a tendency that the adhesion between the second resin layer and the conductor layer is more improved.

Although the organic filler is not particularly limited, examples thereof include a copolymer of acrylonitrile and butadiene, such as a crosslinked NBR particle obtained through copolymerization of acrylonitrile and butadiene, and a copolymer of acrylonitrile, butadiene, and a carboxylic acid, such as acrylic acid; and a so-called core-shell rubber particle in which a core is formed of polybutadiene, NBR, a silicone rubber, etc., and a shell is formed of an acrylic acid derivative. When the organic filler is contained, the elongation of the resin layer is more improved.

<Other Components>

The third thermosetting resin composition can contain, in addition to the aforementioned respective components, other thermosetting resin, a thermoplastic resin, and additives, such as a flame retardant, an antioxidant, a fluidity controlling agent, and a curing accelerator, as the need arises so long as the effects of the present invention are not impaired.

<Support>

In the composite film of the present embodiment, a support may be further provided on a surface of the second resin layer on the side opposite to the first resin layer.

Examples of the support include the same supports which can be used for the resin film for interlayer insulation of the present embodiment as mentioned above.

<Production Method of Composite Film>

The composite film of the present embodiment can be, for example, produced by a method of forming the second resin layer on the support and forming thereon the first resin layer.

For the formation of the first resin layer, the aforementioned varnish for resin film for interlayer insulation (here also referred to as "varnish for first resin layer") can be used.

For the formation of the second resin layer, it is preferred to use a resin varnish having the third thermosetting resin composition dissolved or dispersed in an organic solvent (hereinafter also referred to as "varnish for second resin layer").

A production method of the varnish for second resin layer and the organic solvent which is used for the production of the varnish for second resin layer are the same as those in the aforementioned varnish for resin film for interlayer insulation.

A blending amount of the organic solvent is preferably 70 to 95% by mass, and more preferably 80 to 90% by mass relative to the whole mass of the varnish for second resin layer.

The composite film can be formed by coating the thus produced varnish for second resin layer on the support and then heating for drying, and further coating thereon the varnish for first resin layer and then heating for drying.

The coating method of the varnish for second resin layer or the varnish for first resin layer, and the drying condition after coating such a varnish are the same as the coating method and drying condition in the production method of the resin film for interlayer insulation of the present embodiment, respectively.

Although a thickness of the first resin layer to be formed in the composite film of the present embodiment may be properly determined according to the required performance, from the viewpoint of embedding the conductor layer of the circuit board, it is preferably the thickness of the conductor layer of the circuit board or more. Specifically, since the thickness of the conductor layer which the circuit board has is typically in a range of 5 to 70 μm, the thickness of the first resin layer is preferably 10 to 100 μm. In addition, the thickness of the second resin layer is preferably 1 to 15 μm.

A protective film may be provided on a surface of the first resin layer on which the second resin layer is not provided. Although the thickness of the protective film is not particularly limited, for example, it may be 1 to 40 μm. By providing the protective film, attachment of a dust, etc. and scratch on the surface of the first resin layer can be prevented from occurring. The composite film can be stored upon being wound up in a roll state.

With respect to the composite film of the present embodiment, a cured material thereof preferably has a dielectric tangent at 5 GHz of 0.010 or less, more preferably 0.008 or less, still more preferably 0.006 or less, and especially preferably 0.005 or less. The dielectric tangent of the cured material of the composite film of the present embodiment can be determined by the method described in the section of Examples.

[Printed Wiring Board and Production Method of Same]

A printed wiring board of the present embodiment includes a cured material of the resin film for interlayer insulation of the present embodiment or a cured material of the composite film of the present embodiment. In other words, the printed wiring board of the present embodiment has interlayer insulating layers, and at least one of the interlayer insulating layers includes a cured material of the thermosetting resin composition of the present embodiment.

A method of producing a multi-layered printed wiring board by laminating the resin film for interlayer insulation or composite film of the present embodiment on a circuit board is hereunder explained.

The production method of a printed wiring board according to the present embodiment includes the following steps (1) to (5), and after the step (1), the step (2), or the step (3), the support may be exfoliated or removed.

Step (1): A step of laminating the resin film for interlayer insulation or composite film of the present embodiment on one or both surfaces of a circuit board Step (2): A step of thermally curing the resin film for interlayer insulation or composite film to form an interlayer insulating layer Step (3): A step of boring the circuit board having the interlayer insulating layer formed thereon Step (4): A step of subjecting the surface of the interlayer insulating layer to a roughening treatment Step (5): A step of plating the surface of the roughened interlayer insulating layer <Step (1)>

The step (1) is a step of laminating the resin film for interlayer insulation or composite film of the present embodiment on one or both surfaces of a circuit board. Examples of an apparatus for laminating the resin film for interlayer insulation or composite film include a vacuum laminator. As the vacuum laminator, a commercially available product can be used. Examples of the vacuum laminator as the commercially available product include a vacuum applicator, manufactured by Nichigo-Morton Co., Ltd.; a vacuum & pressure laminator, manufactured by Meiki Co., Ltd.; a roll-type dry coater, manufactured by Hitachi Industries Co., Ltd.; and a vacuum laminator, manufactured by Hitachi AIC Inc.

In the lamination, in the case where the resin film for interlayer insulation or composite film has a protective film, after removing the protective film, the resin film for interlayer insulation or composite film is subjected to pressure bonding to the circuit board while applying a pressure and/or heating.

In the case of using the composite film, the first resin layer is disposed such that it is opposed to the substrate on which the circuit of the circuit board is formed.

As for a condition of the lamination, the resin film for interlayer insulation or composite film and the circuit board may be preheated, as the need arises and laminated at a pressure bonding temperature (laminating temperature) of 60 to 140° C. and a pressure bonding pressure of 0.1 to 1.1 MPa ($9.8 \times 10^4$ to $107.9 \times 10^4$ N/m$^2$) under reduced pressure of 20 mmHg (26.7 hPa) or less in terms of an air pressure. In addition, the method of lamination may be either a batch mode or a continuous mode with a roll.

<Step (2)>

The step (2) is a step of thermally curing the resin film for interlayer insulation or composite film to form an interlayer insulating layer. Although a condition of thermal curing is not particularly limited, for example, it can be selected within a range at 170 to 220° C. for 20 to 80 minutes. After thermal curing, the support may be exfoliated.

<Step (3)>

The step (3) is a step of boring the circuit board having the interlayer insulating layer formed thereon. In the present step, the interlayer insulating layer and the circuit board are bored by a method using a drill, a laser, a plasma, or a combination thereof, or the like, thereby forming a via hole, a through-hole, or the like. As the laser, a carbon dioxide gas laser, a YAG laser, a UV laser, an excimer laser, and so on are generally used.

<Step (4)>

The step (4) is a step of subjecting the surface of the interlayer insulating layer to a roughening treatment. In the present step, in the case where a via hole, a through-hole, or the like is formed at the same time of the roughening treatment by subjecting the surface of the interlayer insulating layer formed in the step (2) with an oxidizing agent, the removal of "smear" generated on the occasion of forming such a hole or the like can also be performed.

Although the oxidizing agent is not particularly limited, examples thereof include permanganates (e.g., potassium permanganate and sodium permanganate), bichromates, ozone, hydrogen peroxide, sulfuric acid, and nitric acid. Of these, roughening and removal of smear may be performed using an alkaline permanganate solution (for example, a potassium permanganate or sodium permanganate solution) that is an oxidizing agent which is widely used for roughening of an interlayer insulating layer in the production of a multi-layered printed wiring board by the build-up process.

<Step 5>

The step (5) is a step of plating the surface of the roughened interlayer insulating layer. In the present step, a semi-additive method in which a power feeding layer is formed on the surface of the interlayer insulating layer by means of electroless plating, a plated resist with a reverse pattern to the conductor layer is subsequently formed, and a conductor layer (circuit) is then formed by means of electroplating can be adopted. After forming the conductor layer, for example, the resultant is subjected to an annealing treatment at 150 to 200° C. for 20 to 120 minutes, whereby the adhesive strength between the interlayer insulating layer and the conductor layer can be improved and stabilized.

A step of roughening the surface of the thus prepared conductor layer may be further included. The roughening of the surface of the conductor layer has an effect for enhancing the adhesion to a resin which comes into contact with the conductor layer. Although a treating agent for roughening the conductor layer is not particularly limited, examples thereof include MECetchBOND (registered trademark) CZ-8100, MECetchBOND (registered trademark) CZ-8101, and MECetchBOND (registered trademark) CZ-5480 (all of which are a trade name, manufactured by MEC Co., Ltd.), all of which are an organic acid-based microetching agent.

The thermosetting resin composition, the resin film for interlayer insulation, the composite film, and the printed wiring board of the present embodiments can be especially suitably used for electronic devices dealing with high frequency signals of 1 GHz or more, and in particular, can be suitably used for electronic devices dealing with high frequency signals of 5 GHz or more, high frequency signals of 10 GHz or more, or high frequency signals of 30 GHz or more.

It should be construed that the present invention is not limited to the aforementioned embodiments. The aforementioned embodiments are examples, and any embodiments having configurations and effects substantially identical to technical concepts described in the claims of the present invention are also included within the technical scope of the present invention.

EXAMPLES

First of all, the invention regarding the first thermosetting resin composition is more specifically explained by reference to Examples, but it should be construed that the present invention is not limited to these Examples.

Production Method 1

<Production of Polyimide Compound (B1)>

In a glass-made flask vessel having a volume of one liter, which was equipped with a thermometer, a reflux condenser, and a stirring device and which could be heated and cooled, 100 parts by mass of 1,6-dimaleimido-(2,2,4-trimethyl) hexane (a trade name: BMI-TMH, manufactured by Daiwa Fine Chemicals Co., Ltd.), 420 parts by mass of 2,2-bis[4-(4-maleimidophenoxy)phenyl]propane (a trade name: BMI-4000, manufactured by Daiwa Fine Chemicals Co., Ltd.), 70 parts by mass of 4,4'-[1,3-phenylenebis(1-methylethylidene)]bisaniline (a trade name: BISANILINE M, manufactured by Mitsui Fine Chemicals, Inc.), and 900 parts by mass of propylene glycol monomethyl ether were charged, and the contents were allowed to react with each other with stirring at a liquid temperature at 120° C. for 3 hours while refluxing. Thereafter, the reaction product was confirmed to have a weight average molecular weight of 3,000 by means of gel permeation chromatography (GPC), cooled, and then subjected to 200-mesh filtration to produce a polyimide compound (B1) (solid content concentration: 65% by mass).

<Measurement Method of Weight Average Molecular Weight>

The weight average molecular weight of the resulting polyimide compound (B1) was converted from a calibration curve using standard polystyrene by means of GPC. The calibration curve was approximated according to a cubic expression using standard polystyrene: TSKstandard POLYSTYRENE (Type: A-2500, A-5000, F-1, F-2, F-4, F-10, F-20, F-40) (a trade name, manufactured by Tosoh Corporation). A condition of GPC is as follows.

Apparatus:
 (Pump: L-6200 Model [manufactured by Hitachi High-Technologies Corporation])
 (Detector: L-3300 Model RI [manufactured by Hitachi High-Technologies Corporation])
 (Column oven: L-655A-52 [manufactured by Hitachi High-Technologies Corporation])
 Column: Guard column; TSK Guardcolumn HHR-L+Column; TSK gel-G4000HHR+TSK gel-G2000HHR (all of which are a trade name, manufactured by Tosoh Corporation)
 Column size: 6.0×40 mm (guard column), 7.8×300 mm (column)
 Elute: Tetrahydrofuran
 Sample concentration: 30 mg/5 mL
 Injection amount: 20 μL
 Flow rate: 1.00 mL/min
 Measurement temperature: 40° C.

\<Production Method of Varnish for First Resin Layer\>
(Production of Varnish A1)

Respective components shown in Table 1 were blended according to the following procedures, to obtain a varnish A1. A blending ratio of the respective components is one described in Table 1 (the unit of each of the numerical values in the table is a part by mass, and in the case of a solution or dispersion liquid, it means an amount as expressed in terms of a solid content).

Aminosilane coupling agent-treated silica (a methyl isobutyl ketone dispersion liquid having a solid content concentration of 51% by mass, manufactured by Admatechs Co., Ltd., average particle diameter: 10 nm) as the nanofiller (a), aminosilane coupling agent-treated silica (a methyl isobutyl ketone dispersion liquid having a solid content concentration of 70% by mass, average particle diameter: 0.5 μm) as the inorganic filler (a') other than the nanofiller (a), and a polybutadiene-based elastomer (a trade name: POLYVEST 75MA, manufactured by Evonik) as the elastomer (C) were mixed.

The above produced polyimide compound (B1) was then mixed therein and dissolved at room temperature by a high-speed rotary mixer.

After dissolution of the polyimide compound (B1) was confirmed through visual inspection, 1,3-phenylenebis(di-2,6-xylenyl phosphate) as a flame retardant, 4,4'-butylidenebis-(6-t-butyl-3-methylphenol) (phenol-based antioxidant), and a polyester-modified polydimethylsiloxane as a fluidity controlling agent were mixed. Thereafter, an organic peroxide (a trade name: PERBUTYL P, manufactured by NOF Corporation) and an isocyanate-masked imidazole (a trade name: G8009L, manufactured by Dai-ichi Kogyo Seiyaku Co., Ltd.) were mixed as curing accelerators, and the mixture was dispersed by a nanomizer treatment, to obtain a varnish A1.

(Production of Varnishes B1 to D1)

Varnishes B1 to D1 were obtained in the same manner as in the varnish A1, except for changing the respective components and blending amounts thereof to blends shown in Table 1.

\<Production Method of Varnish for Second Resin Layer\>

6 parts by mass of a phenolic hydroxy group-containing polybutadiene-modified polyamide resin (a trade name: KAYAFLEX BPAM-155, manufactured by Nippon Kayaku Co., Ltd.) was dissolved in a mixed solvent of dimethylacetamide and cyclohexanone (mixed solvent in a dimethylacetamide/cyclohexanone mass ratio of 7/3) such that its mass concentration was 1.6% by mass. After dissolution, 57.2 parts by mass of an aralkyl novolak type epoxy resin (a trade name: NC-3000-H, manufactured by Nippon Kayaku Co., Ltd., epoxy equivalent: 289 g/mol), 8.8 parts by mass of an inorganic filler (a trade name: AEROSIL (registered trademark) R972, manufactured by Nippon Aerosil Co., Ltd., specific surface area: 110±20 m$^2$/g), 0.4 parts by mass of the same antioxidant as in the varnish A1, 9.1 parts by mass as expressed in terms of a solid content of a phenoxy resin, 14.6 parts by mass as expressed in terms of a solid content of an active ester curing agent (a trade name: HPC-8000-65T (toluene diluted product (65% by mass)), manufactured by DIC Corporation), 0.1 parts by mass as expressed in terms of a solid content of the same fluidity controlling agent as in the varnish A1, and 3.4 parts by mass of a phosphorus-based curing accelerator (adduct of tri-n-butylphosphine and p-benzoquinone) were blended and dissolved, and the varnish was diluted with methyl ethyl ketone such that its solid content concentration was 18% by mass. Thereafter, the diluted varnish was dispersed by a nanomizer treatment, to obtain a varnish for second resin layer.

\<Production of Composite Film\>

Example 1

The thus obtained varnish for second resin layer was coated on a release-treated support (PET film, thickness: 38 μm) by using a comma coater such that the thickness after drying was 2.7 μm, followed by drying at 140° C. for 3 minutes, to form a second resin layer on the support. Subsequently, the varnish A1 for first resin layer was coated on the second resin layer by using a comma coater such that the thickness of the first resin layer after drying was 27.3 μm, followed by drying at 90° C. for 2 minutes. Subsequently, the resultant was wound up in a roll state while sticking a polypropylene film having a thickness of 15 μm serving as a protective film onto the surface of the first resin layer, to obtain a composite film 1 having a support and a protective film.

Examples 2 to 3 and Comparative Example 1

Using the varnishes B1 to D1 for first resin layer, composite films 2 to 4 were obtained in the same manner as in Example 1.

[Preparation of Resin Sheet]

A resin sheet used for the measurement of dielectric tangent was prepared according to the following procedures.

(I) The protective film was exfoliated from the composite film having a support and a protective film obtained in each of Examples 1 to 3 and Comparative Example 1, followed by drying at 120° C. for 3 minutes.

Subsequently, the composite film having a support after drying was laminated on a glossy surface of a copper foil (electrolytic copper foil, thickness: 35 μm) by using a vacuum & pressure laminator (a trade name: MVLP-500/600-II, manufactured by Meiki Co., Ltd.) such that the composite film and the copper foil came into contact with each other, to obtain a laminate (P) in which the copper foil, the composite film, and the support were laminated in this order. The lamination was performed by a method in which the pressure was reduced for 30 seconds to perform bleeding between the layers, the pressure was set regulated to 0.5 MPa, and the resultant was then pressed at 120° C. for 30 seconds under a pressure bonding pressure of 0.5 MPa. Thereafter, the support was exfoliated from the laminate (P).

(II) Subsequently, another composite film having a support and a protective film was prepared, and the protective film was exfoliated, followed by drying at 110° C. for 3 minutes.

(III) Subsequently, the laminate (P) obtained in the above (I), from which the support had been exfoliated, and the composite film having a support after drying as obtained in the above (II) were laminated under the same condition as in the above (I) such that the composite films came into contact with each other, to obtain a laminate (Q) in which the copper foil, the layer composed of two layers of the composite film, and the support were laminated in this order. Thereafter, the support was exfoliated from the laminate (Q).

(IV) Subsequently, the laminate (Q) obtained in the above (III), from which the support had been exfoliated, and a composite film having a support after drying as obtained by the same method as in the above (II) were laminated under the same condition as in the above (I) such that the composite films came into contact with each other, to obtain a laminate (R) in which the copper foil, the layer composed of three layers of the composite film, and the support were laminated in this order.

(V) A laminate (Q) was prepared in the same methods as in the above (I) to (III).

(VI) The supports of the laminate (Q) obtained in the above (V) and the laminate (R) obtained in the above (I) to (IV) were exfoliated, respectively, the composite films of the laminate (Q) and the laminate (R) were stuck to each other, and the resultant was subjected to press molding using a vacuum press at 190° C. for 60 minutes under a pressure bonding pressure of 3.0 MPa. The resulting resin sheet provided with a copper foil on the both surfaces thereof was cured at 190° C. for 2 hours, and the copper foils were etched with ammonium persulfate, to obtain a resin sheet.

[Measurement Method of Dielectric Tangent]

The thus prepared resin sheet was cut out into a test piece having a width of 2 mm and a length of 70 mm, which was then measured for dielectric tangent using a network analyzer (a trade name: E8364B, manufactured by Agilent Technologies) and a 5 GHz-enabled cavity resonator (manufactured by Kanto Electronic Application and Development Inc.). The measurement temperature was set to 25° C. The evaluation results are shown in Table 1. It is indicated that the lower the dielectric tangent, the more excellent the dielectric characteristics are.

[Evaluation Method of Handling Properties of Film]

The handling properties of the composite film having a support and a protective film obtained in each of Examples 1 to 3 and Comparative Example 1 were evaluated by the following methods.

(1) Evaluation by Cutting with Cutter:

The presence or absence of powder dropping on the occasion of cutting the thus prepared composite film having a support and a protective film with a cutter was evaluated. The presence or absence of powder dropping was confirmed through visual inspection, and in the case where no powder dropping was observed, the handling properties were evaluated to be excellent.

(2) Evaluation by Bending:

When the protective film was exfoliated from the thus prepared composite film having a support and a protective film, and the resultant was bent at 180° from the support toward the resin-coated surface, the presence or absence of cracking of the film was evaluated. The presence or absence of cracking of the film was confirmed through visual inspection, and in the case where no cracking was generated, the handling properties were evaluated to be excellent.

In the evaluations of the above (1) and (2), the case where all of the handling properties were excellent was designated as "A", and the case other than that was designated as "B". The evaluation results are shown in Table 1.

[Measurement Method of Minimum Melt Viscosity]

Using a sample prepared by piling up the thus prepared composite films in a thickness of 1.0 mm and punching out in a size of $\phi$20 mm, the minimum melt viscosity was measured. The viscosity was measured with a rheometer (a trade name: ARESG2, manufactured by TA Instruments Japan, Inc.) at a temperature rise rate of 5° C./min with a tool of $\phi$20 mm at a frequency of 1.0 Hz. The minimum melt viscosity as referred to herein is a minimum viscosity when the thermosetting resin composition was melted before commencement of curing under a fixed temperature rise condition.

[Preparation Method of Board for Surface Roughness Measurement]

Aboard for surface roughness measurement was prepared according to the following procedures.

The composite film having a support and a protective film obtained in each of Examples 1 to 3 and Comparative Example 1 was cut into a size of 240 mm×240 mm, and the protective film was then exfoliated.

The resulting composite film having a support was laminated on a printed wiring board having a copper foil subjected to a CZ treatment (a trade name: E-700GR, manufactured by Hitachi Chemical Company, Ltd.) such that the first resin layer and the CZ-treated surface came into contact with each other. The lamination was performed by a method in which after reducing the pressure at 120° C. for 30 seconds to perform bleeding between the first resin layer and the printed wiring board, the pressure was regulated to 0.5 MPa, and the resultant was then pressurized at 120° C. for 30 seconds under a pressure bonding pressure of 0.5 MPa.

Thereafter, the laminate was cooled to room temperature, to obtain a printed wiring board having the composite disposed therein. Subsequently, the printed wiring board having the composite film disposed therein was cured as first-stage curing in an explosion-proof dryer at 130° C. for 20 minutes in a state of being provided with the support and then cured as second-stage curing in an explosion-proof dryer at 190° C. for 40 minutes. After curing, the support was exfoliated to obtain a printed wiring board having an interlayer insulating layer formed therein.

[Roughening Treatment Method]

The thus obtained printed wiring board was subjected to a dipping treatment with a swelling solution heated at 60° C. (a trade name: CIRCUPOSITMLB CONDITIONER 211, manufactured by Rohm and Haas Electronic Materials K. K.) for 10 minutes. Subsequently, the resultant was subjected to a dipping treatment with a roughening solution heated at 80° C. (a trade name: CIRCUPOSITMLB PROMOTER 213, manufactured by Rohm and Haas Electronic Materials K.K.) for 10 minutes. Subsequently, the resultant was subjected to a dipping treatment with a neutralizing solution heated at 45° C. (a trade name: CIRCUPOSITMLB NEUTRALIZER MLB 216, manufactured by Rohm and Haas Electronic Materials K.K.) for 5 minutes, thereby performing neutralization. In this way, the material in which the surface of the interlayer insulating layer of the printed wiring board had been subjected to a roughening treatment was used as the board for surface roughness measurement.

[Measurement Method of Surface Roughness]

A surface roughness of the thus obtained board for surface roughness measurement was measured with a non-contact type surface roughness meter (a trade name: WYKO NT9100, manufactured by Bruker AXS K.K.) using an internal lens of 1 time and an external lens of 50 times, to obtain an arithmetic average roughness (Ra). The evaluation results are shown in Table 1. In view of the gist of the present invention, it is preferred that Ra is smaller, and what it is less than 200 nm is suitable for the formation of a fine wiring.

[Preparation Method of Board for Measurement of Adhesive Strength (Plating Peel Strength) to Plated Copper]

On carrying out the evaluation of adhesive strength to plated copper and the evaluation of reflow heat resistance, an evaluation board was prepared according to the following procedures.

First of all, a printed wiring board provided with a composite film prepared by the same method as mentioned above was cut out into a size of 40 mm x 60 mm, to provide a test piece.

The test piece was subjected to a roughening treatment under the same condition as in the board for surface roughness measurement as mentioned above and then treated with an alkaline cleaner at 60° C. (a trade name: CLEANER SECURIGANTH (registered trademark) 902, manufactured by Atotech Japan K.K.) for 5 minutes, to perform degreasing cleaning. After cleaning, the resultant was treated with a predip liquid at 23° C. (a trade name: PREDIP NEOGANTH (registered trademark) B, manufactured by Atotech Japan K.K.) for 2 minutes. Thereafter, the resultant was treated with an activator liquid at 40° C. (a trade name: ACTIVATOR NEOGANTH (registered trademark) 834, manufactured by Atotech Japan K.K.) for 5 minutes, to attach a palladium catalyst thereto. Subsequently, the resultant was treated with a reducer liquid at 30° C. (a trade name: REDUCER NEOGANTH (registered trademark) WA, manufactured by Atotech Japan K.K.) for 5 minutes.

The thus treated test piece was put into a chemically copper enriched liquid (a trade name: BASIC PRINTGANTH (registered trademark) MSK-DK, manufactured by Atotech Japan K.K.) and subjected to electroless plating until the thickness of the plating on the interlayer insulating layer became 0.5 μm. After the electroless plating, in order to release a stress remaining in the plated film and remove a residual hydrogen gas, a baking treatment was performed at 120° C. for 15 minutes.

Subsequently, the electroless plated test piece was further subjected to electroplating until the thickness of the plating on the interlayer insulating layer became 35 μm, to form a copper layer as the conductor layer. After the electroplating, the resultant was subjected to an annealing treatment at 190° C. for 120 minutes and cured, to obtain a measurement board before preparation of adhesive strength measurement part.

A resist having a width of 10 mm was formed on the copper layer of the resulting measurement board, and the copper layer was etched with ammonium persulfate, to obtain a board for measurement of adhesive strength to plated copper, having a copper layer having a width of 10 mm as the adhesive strength measurement part.

[Measurement Method of Adhesive Strength to Plated Copper]

Using the thus obtained board for measurement of adhesive strength, the measurement of adhesive strength between the interlayer insulating layer and the copper layer was performed by the following method.

A load at the time when one end of the copper layer of the adhesive strength measurement part was taken off at an interface between the copper layer and the interlayer insulating layer, grasped by a gripper, and then ripped at room temperature at a tensile rate in the vertical direction of 50 mm/min using a compact table-top tester (a trade name: EZT Test, manufactured by Shimadzu Corporation) was measured. The evaluation results are shown in Table 1.

[Measurement Methods of Wiring Embedding Properties and Flatness]

The composite film having a support and a protective film obtained in each of Examples 1 to 3 and Comparative Example 1 was cut into a size of 240 mm×240 mm, and the protective film was then exfoliated.

The resulting composite film having a support was laminated on a printed wiring board having a copper wiring in a thickness of 18 μm and a width of 5 mm and a copper wiring in a thickness of 18 μm and a width of 100 μm formed thereon (a trade name: E-700GR, manufactured by Hitachi Chemical Company, Ltd.) such that the first resin layer and the printed wiring board came into contact with each other. The lamination was performed by a method in which the resultant was evacuated at 100° C. for 15 seconds and then pressurized at 0.5 MPa for 45 seconds as a first stage, and subsequently pressed at 120° C. for 60 seconds under a pressure bonding pressure of 0.5 MPa as a second stage. Thereafter, the laminate was cooled to room temperature, to obtain a printed wiring board having a composite film disposed therein. Subsequently, the printed wiring board having a composite film disposed therein was cured as first-stage curing in an explosion-proof dryer at 130° C. for 20 minutes in a state of being provided with the support and then cured as second-stage curing in an explosion-proof dryer at 190° C. for 40 minutes, to obtain a printed wiring board having an interlayer insulating layer formed thereon. Thereafter, the support was exfoliated to obtain a printed wiring board. The copper wiring portion of this printed wiring board was observed through visual inspection. The case where both the embedding properties and the flatness of the copper wiring in a width of 5 mm and the copper wiring in a width of 100 μm were excellent was evaluated as "A"; the case where either one of the embedding properties and the flatness of the copper wiring in a width of 5 mm and the copper wiring in a width of 100 μm was excellent was evaluated as "B"; and the case where both the embedding properties and the flatness of the copper wiring in a width of 5 mm and the copper wiring in a width of 100 μm were poor was evaluated as "C".

TABLE 1

| | | | | | Examples | | | Comparative Example |
|---|---|---|---|---|---|---|---|---|
| | | | | | 1 | 2 | 3 | 1 |
| | | Number of composite film | | | 1 | 2 | 3 | 4 |
| | | Kind of varnish for first resin layer | | | A1 | B1 | C1 | D1 |
| Blending composition of varnish for first resin layer | Inorganic filler (A1) | Average particle diameter: 0.5 μm | (part by mass) | | 76.9 | 76.9 | 76.9 | 77.3 |
| | | Nanofiller (a): Average particle diameter: 10 nm | (part by mass) | | 0.4 | | | |
| | | Nanofiller (a): Average particle diameter: 50 nm | (part by mass) | | | 0.4 | | |
| | | Nanofiller (a): Average particle diameter: 100 nm | (part by mass) | | | | 0.4 | |
| | Thermosetting resin (B) | Polyimide compound (B1) obtained in Production Example 1 | (part by mass) | | 14.9 | 14.9 | 14.9 | 14.9 |
| | Elastomer (C) | POLYVEST MA75 | (part by mass) | | 4.3 | 4.3 | 4.3 | 4.3 |
| | Flame retardant | 1,3-Phenylenebis(di-2,6-xylenyl phosphate) | (part by mass) | | 1.0 | 1.0 | 1.0 | 1.0 |
| | Antioxidant | 4,4'-Butylidene bis-(6-t-butyl-3-methylphenol) | (part by mass) | | 0.1 | 0.1 | 0.1 | 0.1 |
| | Fluidity controlling agent | Polyester-modified polydimethylsiloxane | (part by mass) | | 0.1 | 0.1 | 0.1 | 0.1 |

TABLE 1-continued

|  |  |  |  | Examples | | | Comparative Example |
|---|---|---|---|---|---|---|---|
|  |  |  |  | 1 | 2 | 3 | 1 |
|  | Curing | PERBUTYL P | (part by mass) | 0.2 | 0.2 | 0.2 | 0.2 |
|  | accelerator | G8009L | (part by mass) | 0.04 | 0.04 | 0.04 | 0.04 |
|  | Content of nanofiller (a) on a basis of the total amount of inorganic filler (A1) | | (% by mass) | 0.52 | 0.52 | 0.52 | — |
| Evaluation | Dielectric tangent (5 GHz) | | (—) | 0.0035 | 0.0035 | 0.0035 | 0.0034 |
| results | Handling properties of film | | — | A | A | A | A |
|  | Minimum melt viscosity | | (Pa · s) | 650.0 | 662.0 | 901.0 | 1350.0 |
|  | Surface roughness | | (nm) | 140 | 137 | 138 | 140 |
|  | Plating peel strength | | (kN/m) | 0.55 | 0.54 | 0.56 | 0.55 |
|  | Wiring embedding properties and flatness | | — | A | A | A | C |

From Table 1, it is noted that the composite film using the first thermosetting resin composition of the present embodiment is excellent in the handling properties of film. In addition, from Table 1, the printed wiring boards of Examples 1 to 3 each using the first thermosetting resin composition of the present embodiment are small in the dielectric tangent, low in the minimum melt viscosity, and excellent in the embedding properties and flatness. In addition, it is noted that in the printed wiring boards of Examples 1 to 3 each using the first thermosetting resin composition of the present embodiment, in spite of having a smooth surface (low surface roughness (Ra)), when provided with the adhesive layer, they have an interlayer insulating layer with excellent adhesive strength to plated copper, and hence, they are suitable for the formation of a fine wiring.

Next, the invention regarding the second thermosetting resin composition is more specifically explained by reference to Examples, but it should be construed that the present invention is not limited to these Examples.

Production Example 2

<Production Method of Varnish for First Resin Layer>
(Production of Varnish A2)

Respective components shown in Table 2 were blended according to the following procedures, to obtain a varnish A2. A blending ratio of the respective components is one described in Table 2 (the unit of each of the numerical values in the table is a part by mass, and in the case of a solution or dispersion liquid, it means an amount as expressed in terms of a solid content).

In the inorganic filler (A2), aminosilane coupling agent-treated silica (a methyl isobutyl ketone dispersion liquid having a solid content concentration of 70% by mass, average particle diameter: 0.5 μm) as one in which a peak position of the peak of particle size distribution was present at 0.3 to 0.7 μm and aminosilane coupling agent-treated silica (a methyl isobutyl ketone dispersion liquid having a solid content concentration of 75% by mass, average particle diameter: 1.0 μm) as one in which a peak position of the peak of particle size distribution was present at 0.7 to 1.2 μm, and a polybutadiene-based elastomer (a trade name: POLYVEST 75MA, manufactured by Evonik) as the elastomer (C) were mixed.

The thus produced polyimide compound (B1) was then mixed therein and dissolved at room temperature by a high-speed rotary mixer.

After dissolution of the polyimide compound (B1) was confirmed through visual inspection, the same flame retardant, antioxidant, and fluidity controlling agent as in the varnish A1 were mixed, respectively. Thereafter, an organic peroxide (a trade name: PERBUTYL P, manufactured by NOF Corporation) and an isocyanate-masked imidazole (a trade name: G8009L, manufactured by Dai-ichi Kogyo Seiyaku Co., Ltd.) were mixed as curing accelerators, and the mixture was dispersed by a nanomizer treatment, to obtain a varnish A2.

(Varnishes B2 to D2)

Varnishes B2 to D2 were obtained in the same manner as in the varnish A2, except for changing the respective components and blending amounts thereof to those shown in Table 2.

<Production of Composite Film>

Examples 4 to 6 and Comparative Example 2

Using the varnishes A2 to D2 for first resin layer, composite films 5 to 8 were obtained in the same manner as in Example 1. The varnish prepared in Production Example 1 was used as the varnish for second resin layer.

The obtained composite films were evaluated in the same manners as in Examples 1 to 3, and the results thereof are shown in Table 2.

TABLE 2

|  |  |  |  | Examples | | | Comparative Example |
|---|---|---|---|---|---|---|---|
|  |  |  |  | 4 | 5 | 6 | 2 |
|  |  | Number of composite film |  | 5 | 6 | 7 | 8 |
|  |  | Kind of varnish for first resin layer |  | A2 | B2 | C2 | D2 |
| Blending | Inorganic filler | Average particle diameter: 0.5 μm | (part by mass) | 51.53 | 25.77 | 38.65 | 77.3 |
| composition of | (A2) | Average particle diameter: 0.1 μm | (part by mass) | 25.77 | 51.53 | 38.65 | — |
| varnish for first | Thermosetting | Polyimide compound (B1) obtained in Production | (part by mass) | 17.0 | 17.0 | 17.0 | 17.0 |
| resin layer | resin (B) | Example 1 |  |  |  |  |  |
|  | Elastomer (C) | POLYVEST MA75 | (part by mass) | 4.3 | 4.3 | 4.3 | 4.3 |
|  | Flame retardant | 1,3-Phenylenebis(di-2,6-xylenyl phosphate) | (part by mass) | 1.0 | 1.0 | 1.0 | 1.0 |

TABLE 2-continued

|  |  |  |  | Examples | | | Comparative Example |
|---|---|---|---|---|---|---|---|
|  |  |  |  | 4 | 5 | 6 | 2 |
|  | Antioxidant | 4,4'-Butylidene bis-(6-t-butyl-3-methylphenol) | (part by mass) | 0.1 | 0.1 | 0.1 | 0.1 |
|  | Fluidity controlling agent | Polyester-modified polydimethylsiloxane | (part by mass) | 0.1 | 0.1 | 0.1 | 0.1 |
|  | Curing accelerator | PERBUTYL P | (part by mass) | 0.2 | 0.2 | 0.2 | 0.2 |
|  |  | G8009L | (part by mass) | 0.04 | 0.04 | 0.04 | 0.04 |
| Evaluation results |  | Dielectric tangent (5 GHz) | (—) | 0.0035 | 0.0035 | 0.0035 | 0.0035 |
|  |  | Handling properties of film | — | A | A | A | A |
|  |  | Minimum melt viscosity | (Pa · s) | 610.0 | 420.0 | 530.0 | 1350.0 |
|  |  | Surface roughness | (nm) | 140 | 137 | 138 | 140 |
|  |  | Plating peel strength | (kN/m) | 0.55 | 0.54 | 0.56 | 0.55 |
|  |  | Wiring embedding properties and flatness | — | A | A | A | C |

From Table 2, it is noted that the composite film using the second thermosetting resin composition of the present embodiment is excellent in the handling properties of film. In addition, from Table 2, the printed wiring boards of Examples 4 to 6 each using the second thermosetting resin composition of the present embodiment are small in the dielectric tangent, low in the minimum melt viscosity, and excellent in the embedding properties and flatness. In addition, it is noted that in the printed wiring boards of Examples 4 to 6 each using the second thermosetting resin composition of the present embodiment, in spite of having a smooth surface (low surface roughness (Ra)), when provided with the second resin layer, they have an interlayer insulating layer with excellent adhesive strength to plated copper, and hence, they are suitable for the formation of a fine wiring.

INDUSTRIAL APPLICABILITY

The thermosetting resin composition of the present invention is low in the dielectric tangent and low in the thermal expansion, and the resin film for interlayer insulation and the composite film, each using the thermosetting resin composition of the present invention, are excellent in the wiring embedding properties and flatness. In consequence, the thermosetting resin composition, the resin film for interlayer insulation, the composite film, and the printed wiring board of the present invention are useful for electric appliances, such as computers, mobile phones, digital cameras, and television receivers; vehicles, such as motorcycles, automobiles, trains, ships, and aircrafts; and so on.

REFERENCE SIGNS LIST

1: First resin layer
2: Second resin layer
3: Support
4: Protective film

The invention claimed is:

1. A resin film for interlayer insulation, comprising a thermosetting resin composition comprising an inorganic filler (A1) containing nanofiller (a) selected from the group consisting of silica, alumina, and titanium oxide, the nanofiller (a) having an average particle diameter of 300 nm or less, and an inorganic filler (a') other than the nanofiller (a), the inorganic filler (a') comprising fused silica, a thermosetting resin (B), and an elastomer (C), wherein the content of nanofiller (a) is from 0.1 to 1.0% by mass relative to the total amount of the inorganic filler (A1), wherein the resin film does not contain a glass cloth, and wherein a thickness of the resin film is 5 to 100 μm.

2. The resin film according to claim 1, wherein the content of the inorganic filler (A1) is 60% by mass or more in a solid content of the thermosetting resin composition.

3. The resin film according to claim 1, wherein the thermosetting resin (B) is a polyimide compound having a structural unit derived from a maleimide compound (b1) having at least two N-substituted maleimide groups and a structural unit derived from a diamine compound (b2).

4. A composite film, comprising a first resin layer comprising the resin film according to claim 1 and a second resin layer.

5. The composite film according to claim 4, wherein the second resin layer comprises a thermosetting resin composition for second resin layer comprising a polyfunctional epoxy resin (D), an active ester curing agent (E), and a phenolic hydroxy group-containing polybutadiene-modified polyimide resin (F).

6. The composite film according to claim 4, which exhibits a dielectric tangent at 5 GHz of 0.005 or less in terms of a cured material thereof.

7. A printed wiring board comprising a cured material of the resin film for interlayer insulation according to claim 1.

8. A method of producing a printed wiring board, comprising a step of laminating the resin film for interlayer insulation according to claim 1.

* * * * *